(12) United States Patent
Takei et al.

(10) Patent No.: US 11,826,855 B2
(45) Date of Patent: Nov. 28, 2023

(54) DEPOSITION MASK, MASK MEMBER FOR DEPOSITION MASK, METHOD OF MANUFACTURING DEPOSITION MASK, AND METHOD OF MANUFACTURING ORGANIC EL DISPLAY APPARATUS

(71) Applicant: HON HAI PRECISION INDUSTRY CO., LTD., New Taipei (TW)

(72) Inventors: Hideo Takei, Osaka (JP); Susumu Sakio, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/876,838

(22) Filed: Jul. 29, 2022

(65) Prior Publication Data

US 2022/0362888 A1    Nov. 17, 2022

Related U.S. Application Data

(62) Division of application No. 16/083,524, filed as application No. PCT/JP2016/071621 on Jul. 22, 2016, now Pat. No. 11,433,484.

(30) Foreign Application Priority Data

Mar. 10, 2016  (JP) ................................ 2016-047209

(51) Int. Cl.
| | |
|---|---|
| *B23K 26/362* | (2014.01) |
| *H10K 71/16* | (2023.01) |
| *B23K 26/38* | (2014.01) |
| *C23C 14/04* | (2006.01) |

(52) U.S. Cl.
CPC ............ *B23K 26/362* (2013.01); *B23K 26/38* (2013.01); *C23C 14/042* (2013.01); *C23C 14/048* (2013.01); *H10K 71/166* (2023.02)

(58) Field of Classification Search
CPC .... B23K 26/362; B23K 26/38; C23C 14/042; C23C 14/048; H10K 71/166; H01L 51/0011
USPC ....................................... 219/121.69; 438/99
See application file for complete search history.

(56) References Cited

U.S. PATENT DOCUMENTS

| | | |
|---|---|---|
| 2015/0379924 A1 | 12/2015 | Matsueda et al. |
| 2016/0115580 A1* | 4/2016 | Mizumura ............ C23C 14/042 264/400 |
| 2016/0281209 A1 | 9/2016 | Mizumura |

FOREIGN PATENT DOCUMENTS

| | | |
|---|---|---|
| JP | H08-141766 A | 6/1996 |
| JP | 2002-134918 A | 5/2002 |
| JP | 2002-271037 A | 9/2002 |
| JP | 2002-271039 A | 9/2002 |
| JP | 2003-260579 A | 9/2003 |
| JP | 2004-322173 A | 11/2004 |

(Continued)

*Primary Examiner* — Dana Ross
*Assistant Examiner* — James F Sims, III
(74) *Attorney, Agent, or Firm* — ScienBiziP, P.C.

(57) ABSTRACT

A deposition mask includes a resin film defining a plurality of opening portions. Each opening portions extends through the resin film. The resin film includes a first surface and a second surface opposite to the first surface. The second surface is a surface faced to a vapor deposition source during vapor deposition. The resin film defines dents comprising laser marks on the first surface. A mask member for a deposition mask is also provided.

9 Claims, 11 Drawing Sheets

(56) References Cited

FOREIGN PATENT DOCUMENTS

| | | |
|---|---|---|
| JP | 2014-133938 A | 7/2014 |
| JP | 2014-135246 A | 7/2014 |
| JP | 2015-120947 A | 7/2015 |
| JP | 2016-009636 A | 1/2016 |

* cited by examiner

DEPOSITION MASK, MASK MEMBER FOR DEPOSITION MASK, METHOD OF MANUFACTURING DEPOSITION MASK, AND METHOD OF MANUFACTURING ORGANIC EL DISPLAY APPARATUS

CROSS-REFERENCE TO RELATED APPLICATIONS

This application is a divisional application of U.S. Ser. No. 16/083,524, filed Sep. 10, 2018 the contents of which are hereby incorporated by reference.

TECHNICAL FIELD

The present invention relates to a deposition mask for use in, for example, depositing an organic layer in an organic EL display apparatus, a mask member for the deposition mask, a method of manufacturing the deposition mask, and a method of manufacturing the organic EL display apparatus. More specifically, the present invention relates to a deposition mask configured such that laser light can form a pattern of opening portions without generating burrs, mask member for the deposition mask, a method of manufacturing the deposition mask, and a method of manufacturing an organic electroluminescence (EL) display apparatus by using the deposition mask.

BACKGROUND ART

When an organic EL display apparatus is manufactured, a device substrate is formed by forming switching elements, such as thin-film-transistors (TFTs) and so on, on a device substrate, and then organic layers are deposited on the device substrate at each pixel. In this case, a deposition mask is placed on the device substrate, and an organic material is deposited on the device substrate via the deposition mask, so that a necessary organic layer is selectively deposited on a necessary pixel only. A metal mask is conventionally used as the deposition mask. However, in order to form a finer pattern of opening portions, a stacked deposition mask formed of a resin film and a metal support layer tends to be used in recent years, in place of the metal mask.

Although a display panel becomes a large size recently, it needs to satisfy requirements of high definition and light weight. For example, as shown in FIG. 10, a metal support layer 82 is formed on a resin film 81. And a frame body 83 is fixed on its periphery and the assembly is fixed on a process stage 85 with a protective layer 84 therebetween. The resin film 81 is irradiated with laser light from the top of the page of FIG. 10, so that a pattern of opening portions 81*a* is formed in the resin film 81, as illustrated in FIG. 10. The protective layer 84 may be formed using a resin layer or a liquid layer made of ethanol or the like, that cannot be processed by the laser light (e.g., see Patent Documents 1 and 2).

PRIOR ART DOCUMENT

Patent Document

Patent Document 1: JP 2014-133938 A
Patent Document 2: JP 2014-135246 A

SUMMARY OF THE INVENTION

Problem to be Solved by the Invention

As mentioned above, in the deposition mask, the pattern of the opening portions 81*a* is formed on the resin film 81 with the laser light, and the protective layer 84, made of a resin layer or a liquid layer made of ethanol or the like, is formed in the lower surface of the resin film 81. However, when the resin film 81 is irradiated with the laser light, some small resin pieces may be scattered in the air and attach as burrs 81*b* to the surface of the resin film 81, and around the opening portions 81*a*, or the surface of the resin film 81 which is left like a grid, and some small resin pieces may droop down therein from the edges of the opening portions 81*a*.

In order to meet recent requirements of high-definition images, for example, in the deposition mask for the organic EL display apparatus, the size of each pixel (opening portion) is set at approximately 30 μm on each side (400 PPI). Because of this, if any small piece overlaps with the opening portion 81*a*, the area of each pixel may greatly decrease, causing a lowered display quality. It is preferable that no burrs is present in the opening portions 81*a*.

During vapor deposition, a vapor deposition material evaporated from a vapor deposition source, such as a crucible, is deposited on a substrate for vapor deposition via a deposition mask. For this reason, the vapor deposition source and the deposition mask are placed opposed to each other at a short distance, so that heat from the vapor deposition source is transferred as radiant heat to the resin film of the deposition mask. Consequently, the temperature of the deposition mask easily increases. If the temperature of the deposition mask increases, the opening portion of the resin film is enlarged. In this case, an organic material may attach to not only intended pixel areas but also other areas, causing a lowered display quality.

The present invention has been made to solve these problems, and it is an object of the present invention to provide a deposition mask which has opening portions defined by opening portions of a resin film, and in which portions of the resin film located in the respective opening portions are completely removed without causing small pieces of the resin film to attach as burrs to the opening portions of the deposition mask and without leaving any part of the resin film at the bottom of the opening portion of the resin film, and also to provide a method of manufacturing the deposition mask and a mask member for the deposition mask.

It is another object of the present invention to provide a deposition mask which can exhibit an additional effect of preventing an increase in the temperature of the deposition mask itself during vapor deposition by radiating heat of the deposition mask as much as possible through utilizing a process of removing burrs and foreign particles from the deposition mask.

It is a further object of the present invention to provide a method of manufacturing an organic EL display apparatus which achieves high display quality by using the deposition mask formed by the above manufacturing method.

Means to Solve the Problem

A method of manufacturing a deposition mask according to the present invention is characterized by the deposition mask having a resin film on which a pattern of opening portions is formed, the method comprising: disposing a light irradiation source on one side of the resin film, the light irradiation source being adapted to emit laser light for forming the pattern of the opening portions; providing a reflective film on another side of the resin film, the reflective film being adapted to reflect the light having the wavelength of the laser light emitted from the light irradiation source, and using the laser light reflected by the reflective film to form the pattern of the opening portions in the resin film.

A deposition mask according to the present invention comprises a resin film in which a pattern of opening portions is formed, wherein the resin film of the deposition mask has a dent including a laser mark on a surface opposite to a surface faced to a vapor deposition source during vapor deposition.

A mask member for a deposition mask according to the present invention is a mask member wherein the deposition mask has a resin film in which a pattern of opening portions is formed, the mask member comprising: the resin film, one surface of the resin film being irradiated with laser light for forming the pattern of the opening portions in the resin film; and a reflective film provided on another surface opposite to the one surface of the resin film, the reflective film provided on another surface opposite to the one surface of the resin film, the reflective film being adapted to reflect the light having the wavelength of the laser light.

A method of producing an organic EL display apparatus according to the present invention is a method of producing an organic EL display apparatus by depositing organic layers on a device substrate, the method comprising: overlying and positioning, on the device substrate, the deposition mask manufactured by the method described above, the device substrate being formed by forming a thin-film transistor (TFT) and a first electrode formed on a support substrate; forming an organic deposition layer on the device substrate by depositing an organic material; and forming a second electrode on the organic deposition layer.

Effects of the Invention

According to the method of manufacturing a deposition mask of the present invention, when the pattern of the opening portions is formed in the resin film, the front surface of the resin film (the surface located on the side of the laser light irradiation source) is irradiated with the laser light, and additionally the back surface of the resin film (the surface opposite to the front surface) is irradiated with the reflected light from the reflective film. In this case, the laser light is absorbed in the resin film from the back surface side as well as the front surface side. Consequently, the resin film can be completely sublimed from not only the front surface side but also the back surface side. If an opening portion-formation region of the resin film is irradiated with laser light having a stronger intensity than that of conventional laser light, the temperature of the front surface of the resin film may increase excessively, which tends to make the size of the opening portion larger than an expected one. The present invention is characterized in that the reflected light is simultaneously used while irradiating the resin film with the conventional intense laser light, thereby allowing the resin film to be irradiated with the laser light from the back surface as well as the front surface of the resin film. That is, by irradiating the resin film with the reflected light of the laser light from the side of its back surface, burrs of the resin film, which would be left on and droop from the back surface of the conventional resin film, can be easily removed.

In this case, even if the resin film is irradiated with the laser light from the back surface from an initial stage, resin material on the back surface may not sublime and scattered when the resin material is originally distributed densely on its front surface. However, the present invention also utilizes the reflected light of the laser light emitted from the front surface side. Therefore, when the resin material on the front surface side of the resin film is not sublimed at all, the laser light is absorbed in the resin film with no reflected light therefrom. However, once the resin material on the front surface is sublimed and opening portions are formed to some extent, the emitted laser light passes through the resin film without being absorbed in the resin film so much. The part of the laser light which has passed through the resin film is reflected by the reflective film and then absorbed in the resin film from the back surface side of the resin film. Thus, the reflected light can sublimate the resin material from the back surface side of the resin film, and then discharge the sublimed resin material from the front surface side of the thin resin film. Consequently, the laser light is effectively absorbed even when burrs droop from the back surface of the resin film, so that the pattern of the opening portions can be perfectly formed with no burrs left.

According to the deposition mask of the present invention, the above reflected light creates a laser mark on the back surface of the resin film around the opening portion, thereby making the back surface of the resin film uneven. This uneven back surface of the resin film which is opposite to the front surface facing a vapor deposition source during vapor deposition becomes a surface that faces a substrate for vapor deposition. Since the deposition mask is heated by the vapor deposition source to readily increase the temperature of the resin film, it is preferable that the deposition mask adequately dissipates heat. With regard to this, such formation of the uneven surface opposite to the side of the vapor deposition source leads to an increase in the surface area, which contributes to significant heat radiation. Furthermore, a high-heat-radiation film having a significant thermal emissivity is preferably formed on the surface with the laser mark formed thereon, because such a high-heat-radiation film improves the heat dissipation of the resin film through the radiation.

According to the mask member for the deposition mask of the present invention, the reflective film already formed in the above manner enables a deposition mask to be formed almost without generating any burrs simply by irradiation with the laser light via a desired laser mask.

According to the method of manufacturing an organic EL display apparatus of the embodiment of the present invention, an organic layer is deposited with the deposition mask having a precise, burr-less pattern. Therefore, an organic layer is formed very precisely in each pixel. Consequently, this method makes it possible to provide an organic EL display apparatus which achieves very high display quality.

EMBODIMENT FOR CARRYING OUT THE INVENTION

Figure 1:
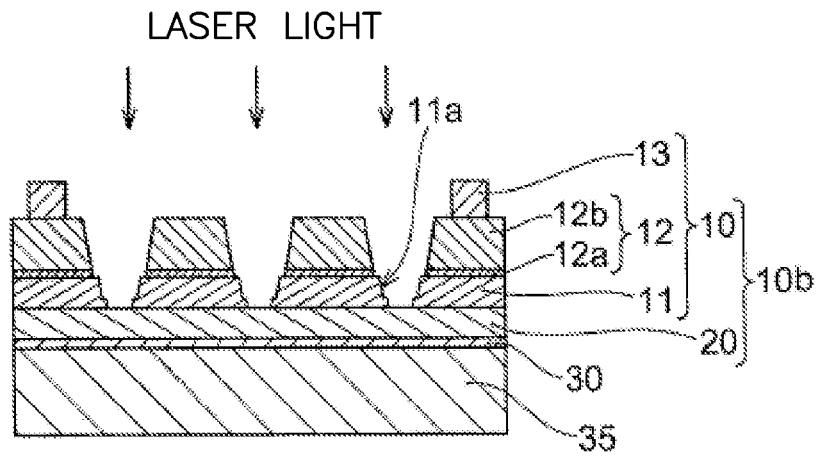
FIG. 1 is an explanatory cross-sectional view showing a state in which a mask member for a deposition mask according to one embodiment of the present invention is placed on a process stage, and opening portions are formed in a resin film.

Hereinafter, a deposition mask, a method of manufacturing the deposition mask, and a mask member for the deposition mask according to one embodiment of the present invention will be described with reference to the accompanying drawings. FIG. 1 is an explanatory view of a cross section of a deposition mask 10 formed in a state where opening portions are formed in a mask member according to one embodiment of the present invention, and FIGS. 2A to 2G are explanatory views of cross sections in respective steps of a method of manufacturing the deposition mask. Although only three opening portions are shown in the figures, in practice, the deposition mask may have a larger number of opening portions, for example, corresponding to the number of pixels (including R, G, and B sub-pixels) of a plurality of organic EL display apparatuses.

Figure 9A:
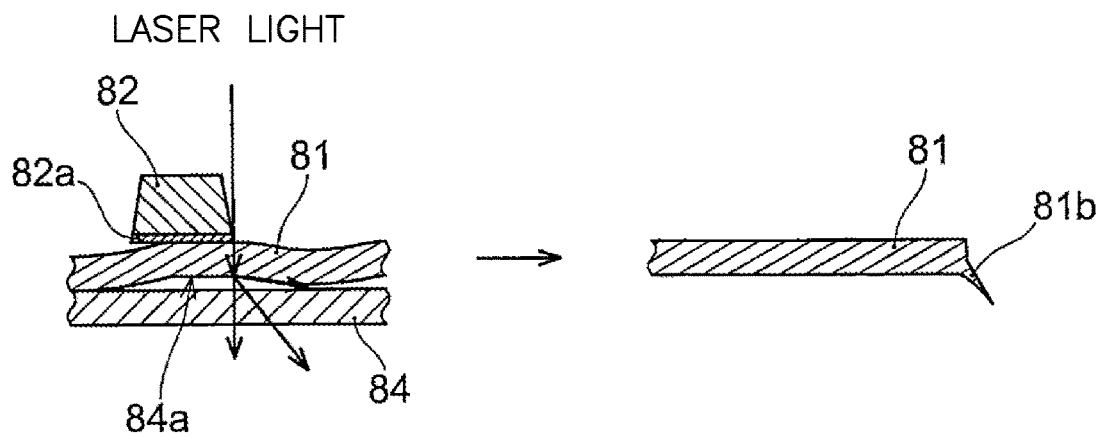
FIG. 9A is an explanatory diagram of a problem raised in a structure shown in FIG. 10.
Figure 9B:
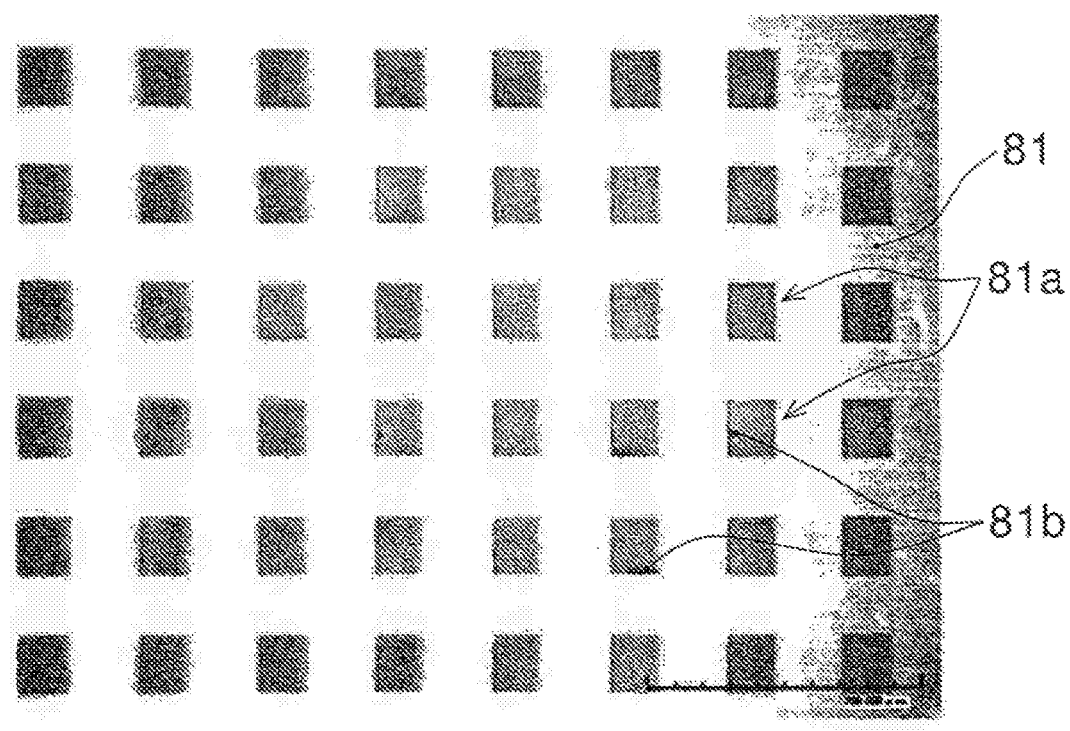
FIG. 9B is a picture showing the occurrence of burrs in a resin film produced by a method shown in FIG. 10.
Figure 9C:
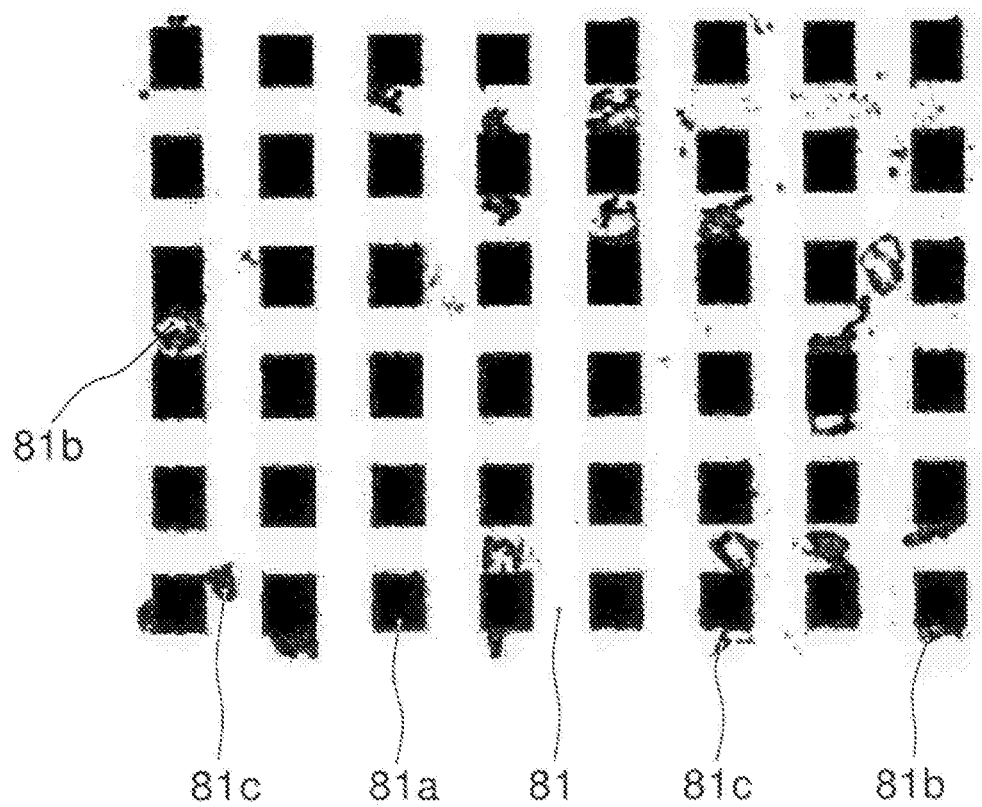
FIG. 9C is a picture showing another example of the occurrence of burrs in a resin film produced by the method shown in FIG. 10.
Figure 10:
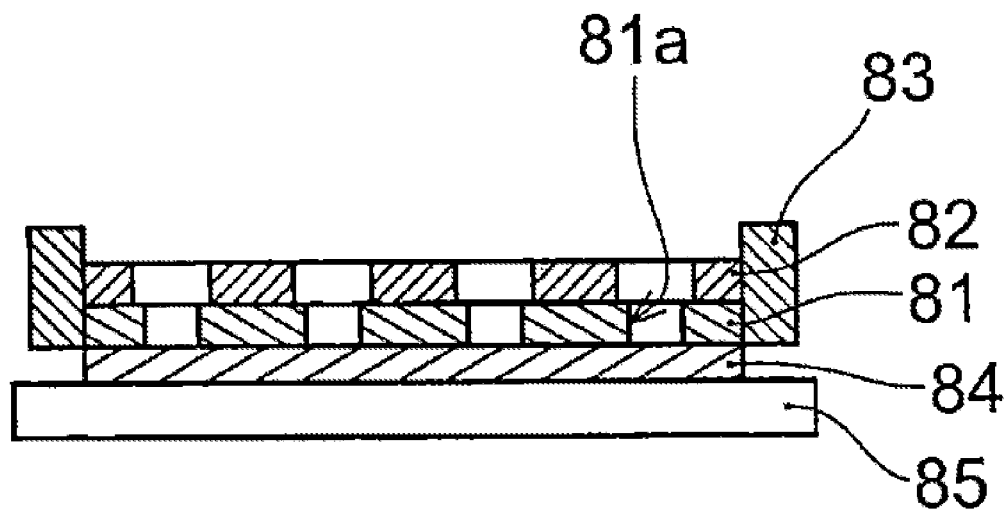
FIG. 10 is an explanatory view of an example of manufacturing a conventional deposition mask.

The present inventors have found that burrs 81b and foreign particles 81c may be generated, for example, as illustrated in FIG. 9B or 9C, even when the opening portions 81a are formed in a resin film 81 on a protective layer 84 made of a resin layer or a liquid layer as illustrated in FIG. 10 mentioned above. FIG. 9B is a picture when using a resin layer as the protective layer 84, and FIG. 9C is a picture when using an ethanol as the protective layer 84. In these pictures, the foreign particles 81c attach to the resin film 81 as dust particles, and the burrs 81b extend to within the opening portions 81a. Some of the burrs 81b droop as described above, whereas some of the burrs 81b attach again to the resin film 81 after scattered in the air. Note that FIGS. 9B and 9C show the pictures of the resin film 81 after removing the process stage 85 and the protective layer 84, and before washing. Specifically, FIG. 9B shows the picture of the surface of the resin film 81 observed from a side opposite to a laser light irradiation side, and FIG. 9C shows the picture of the surface of the resin film 81 observed from the laser light irradiation side in the same manner.

The present inventors have intensively studied the cause of the close contact of the burr 81b and the foreign particle 81c to the resin film 81, and found that, for example, as shown in FIG. 9A, a part of the resin film 81 droops, thus generating the burrs 81b. As a result of further studies about this cause, it is considered that the close contact of the burrs and foreign particles is due to the fact that the resin film 81 is thermally deformed to form a gap 84a between the protective layer 84 and the resin film 81 as shown in FIG. 9A. That is, if a part of the surface of the resin film 81 is irradiated weakly with the laser light, resin material in this part are less likely to sublime from the front surface side of the resin film and may fail to sublime completely. Eventually, a thin part of the resin film 81 tends to be left there. This thin remaining part of the resin film 81 is more likely to droop due to shock of the laser light. As a result, it is thought that such drooping of a part of the resin film 81 generates burrs 81b as shown in the right diagram of FIG. 9A. In other words, even when the resin film 81 is irradiated with the laser light, all resin parts of the resin film 81 located in the opening portions are not completely sublimed to be scattered in the air. Some of these resin parts may be partially broken and scattered in the air to attach to the deposition mask made of the resin film. Some resin parts may be bent downward without being sublimed completely and left as burrs 81b to partially cover the opening portions 81a. In FIG. 9A, reference number 82a denotes a seed layer for forming a metal support layer 82 by a plating method. However, the seed layer is not required in a case where the metal support layer is not formed by the plating method. Such burrs or foreign particles could be transferred to the substrate for vapor deposition to become obstacles to the vapor deposition, causing black spots on a resultant image displayed on a display screen. In this way, the burrs and foreign particles cause troubles.

Furthermore, the present inventors have intensively studied in order to prevent a part of the resin of the resin film from being incompletely sublimed and remaining as burrs in the opening portion of the deposition mask including the resin film, or to prevent a scattered part of the resin from attaching as burrs inside the opening portion. As a result of this study, the inventors have found that the reason why a part of the resin film remains without being sublimed is that since the output of the irradiated laser light is not uniform as a whole, there occurs a weak part of the laser light, and hence this weak part of the laser light cannot completely sublimate the resin. Further, another reason is that as described above, when the resin film is deformed by heat during irradiation with the laser light, a space is formed between the resin film and the protective layer, and if a part of the resin droops into the space, the resin film becomes more difficult to irradiate with the laser light and are eventually more likely to remain as burrs. Moreover, the inventors have conceived of not only irradiation with the laser light from the front surface side of the resin film, but also irradiation with the laser light from the back surface side of the resin film using the reflected light of the laser light transmitted through the resin film. Consequently, the present inventors have found that all parts of the resin film located in the opening portions substantially across the entire surface of the resin film can be removed without leaving any resin in the opening portions by adding the laser light reflected from the back surface of the resin film even if the laser light rays are partially weak in intensity.

The following two phenomena are considered as main reasons why burrs can be effectively removed by using the reflected light of the laser light. First, it is considered that the reflected laser light is generated mainly when the resin on the front surface (the surface of the resin film on the light irradiation source side for the laser light) of the resin film in each of the opening portions is removed by sublimation, and at this time, the resin is easily sublimed even by irradiation with the laser light from the back surface (the surface opposite to the front surface) side of the resin film. Supposing that opening portions are formed by laser light in a resin film made of polyimide or the like which has a thickness of approximately several μm to 10 μm, pulsed laser light sequentially strikes the resin film at approximately 50 shots or less to 100 shots or more. The wavelength of this laser light is selected, at which the resin easily adsorbs the laser light. In the initial irradiation with the laser light, most of the laser light is absorbed in the resin film from the front surface side, so that the resin in the front surface side of the resin film is sublimed. Here, the laser light hardly reaches to reach a reflective film, and thus a reflected light is hardly generated. Then, when an opening portion-formation region of the resin film becomes considerably thin, the emitted laser light is not completely absorbed in the resin film, and thus the laser light partly passes through the resin film and exits from the back surface side thereof to reach the reflective film. Thus, in the presence of the reflective film on the back surface side, the laser light is reflected and returned back to the resin film. This reflected light from the back surface side is absorbed in the resin film. At that time, since the resin in the opening portion-formation region of the front surface side is mostly removed, the resin on the back surface side also tends to sublime. In other words, when the situation is reached in which resin material in the back surface of the resin film is easily sublimed, the reflected light is automatically intensified, thereby enabling the resin to sublime.

Secondly, some of the laser light is incident on the front surface of the resin film at an incident angle of at most approximately 30° or less. Some of the laser light is incident substantially vertical, namely, at an incident angle of approximately 0°. As a result, an area on the back surface of the resin film to which the reflected light is returned is limited to the opening portion-formation region and its surrounding, depending on the thickness and refractive index of a close contact layer. Specifically, the laser light incident vertically on the resin film is also reflected vertically by the reflective film as it is. However, the laser light is not always incident vertically. The laser light that is incident on the resin film at some incident angle are reflected diagonally. Because of this, even when some parts of the resin film potentially remain after the irradiation with the laser light due to the presence of the partially weak laser light, the diagonally coming, reflected light is easily absorbed in these parts, thereby successfully facilitating the sublimation of the parts. However, since the incident angle of the laser light ranges of approximately 0° or more and 30° or less, the reflected light does not spread out so widely. The detailed relationship between the incident angle and the reflected light will be described later. Thus, the whole area of the resin film does not receive the reflected light of the laser light, and any laser marks formed by irradiating parts of the back surface of the resin film other than the opening portion-formation region by the reflected light have a depth of approximately 0.3 μm or less, and it is obviously less than 1 μm. Consequently, this does not lead to a problem of reduced mechanical strength of the resin film. Rather, since laser marks are also formed on the area of the surface other than the opening portions, a surface area of the resin film becomes larger due to the unevenness of its surface, resulting in an increase in heat radiation. As a result, the temperature of the deposition mask, which increases due to the radiation heat from the vapor deposition source during vapor deposition, is dissipated from the surface of the deposition mask on the opposite side to the vapor deposition source, which contributes to lowering the temperature of the deposition mask. That is, the surface of the deposition mask on which the laser marks are formed is a surface to be superposed onto a substrate for vapor deposition, in other words, the surface of the deposition mask located on an opposite side to a surface facing the vapor deposition source. The resin film with the larger heat radiation is more convenient from the viewpoint of reducing the temperature of the deposition mask.

As shown in FIG. 1, the method of manufacturing a deposition mask according to the present embodiment is characterized by comprising depositing a light irradiation source on one surface of the resin film 11, the light irradiation source being adapted to emit laser light for forming the pattern of the opening portions 11a; providing a reflective film 30 on the other surface of the resin film 11, the reflective film 30 being adapted to reflect the light having the wavelength of the laser light emitted from the light irradiation source for the laser light, and using the laser light reflected by the reflective film 30 to form the pattern of the opening portions 11a in the resin film 11 That is, as shown in FIG. 1, the first feature of the present invention is that the reflective film 30 is formed on the other surface of the resin film 11 located on an opposite side to the irradiation source side of the laser light.

In the example shown in FIG. 1, a close contact layer 20 is formed between the resin film 11 and the reflective film 30. The reason why the close contact layer 20 is formed in this manner is to prevent formation of an air layer between the resin film 11 and the reflective film 30 as much as possible. That is, if the surface of the resin film 11 is formed in a wave shape with the air layer interposed between the resin film 11 and the reflective film 30, the laser light is more likely to be diffusely reflected at the interface therebetween because of a small refractive index of the air layer. In addition, there is a higher possibility that the reflected light is reflected by the reflective film 30 in the direction away from the opening portion 11a. For this reason, preferably, a layer having a refractive index as close as possible to the refractive index of the resin film 11 contacts to the resin film 11. If the refractive index of the close contact layer 20 is higher than that of the resin film 11, the refraction angle is smaller than the incident angle in the close contact layer 20, as the refracted light is likely to approach the incident light which is incident vertically. Meanwhile, as the close contact layer 20 needs to be finally removed from the resin film 11, the close contact layer 20 is required to be separable easily from the resin film 11. The close contact layer 20 is preferably made of a material that absorbs the laser light for forming the opening portions 11a as little as possible. This is because for the purpose of utilizing the reflected light, the light transmitted through the resin film 11 is preferably reflected without being wasted as much as possible. More specifically, the close contact layer 20 may be a resin film that transmits approximately 80% or more of near-ultraviolet light (in a wavelength range of 200 to 380 nm) (which is referred to below simply as the "resin film"). Examples of the resin film include a polyvinyl acetate (PVAC) film, a polyvinyl pyrrolidone (PVP) film, a self-assembled molecular (SAM) film and the like.

The present embodiment aims to use the laser light reflected by the reflective film 30 to locally heat the back surface of the resin film 11. For this purpose, a range of which the laser light reflected by the reflective film 30 reaches to the back surface of the resin film 11 needs to fall within a range of a focal depth of convergent laser light. In this case, for example, the focal depth of the laser light is set to approximately ±10 μm. For instance, in the case of the laser light focused on the front surface of the resin film 11, if the thickness of the resin film 11 is 5 μm, for example, the thickness of the close contact layer 20 would be 2.5 μm, so that the round-trip distance through the close contact layer 20 is 5 μm. Consequently, the back surface of the resin film 11 is positioned at the limit of the focal depth of 10 μm. Therefore, the thickness of the close contact layer 20 needs to be 2.5 μm or less. If the resin film 11 is thicker, by adjusting the convergence point of the laser light to the interior or back surface of the resin film 11, the reflected light reaches the back surface side of the resin film 11 within the focal depth range and thereby can heat the back surface of the resin film 11. In this way, by focusing the convergence point onto the interior or back surface of the resin film 11, the close contact layer 20 could be thickened. However, as described above, since the close contact layer 20 is provided in order to obtain the close contact between the resin film 11 and the reflective film 30, the close contact layer 20 is preferably as thin as possible from the viewpoint of the loss of the laser light and the manufacturing cost. Accordingly, the thickness of the close contact layer 20 is 0.1 μm or more and 3 μm or less, preferably 0.1 μm or more and 2.5 μm or less, and more preferably 0.1 μm or more and 2 μm or less.

To reduce the spreading of the reflected light, as described above, the refractive index of the close contact layer 20 is preferably set to be equal to or more than that of the resin film 11. However, in consideration that the laser light includes a partly weak portion and the possibility of generating a resin part where sublimation is insufficient, it is advantageous for the laser light having passed through the resin film 11 to be reflected diagonally rather than vertically, in order to completely sublimate non-sublimed resin parts of the resin film 11 with the strong laser light. From this aspect, the refractive index of the close contact layer 20 is not necessarily equal to or more than that of the resin film 11. Further, even if an air gap is formed between the resin film 11 and the close contact layer 20, the angle of refraction of the incident light into the close contact layer 20 becomes small although the angle of refraction of the incident light from the air gap is large, because the refractive index of the close contact layer 20 is greater than that of the air gap. Thus, there is no problem as long as the width of the air gap is narrow. As described above, the close contact layer 20 preferably does not absorb any laser light (for example, light with a wavelength of 335 nm). Because of this, the close contact layer 20 is formed using a material that has a transmittance of 70% or more, preferably 80% or more, and more preferably 85% or more at the wavelength of the light.

Figure 5:
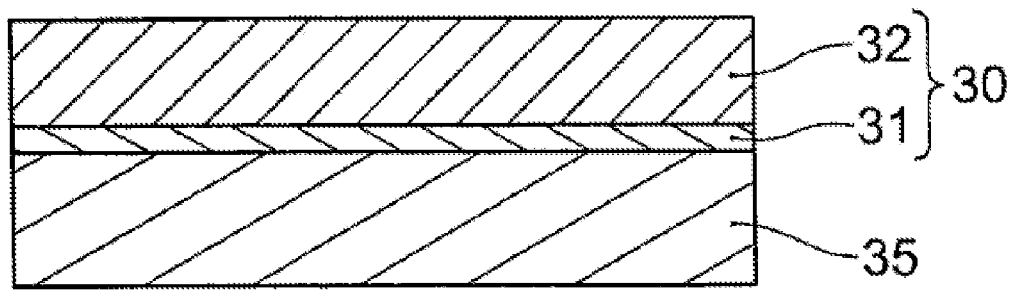
FIG. 5 is an explanatory cross-sectional view of an example of a reflective film in an embodiment of the present invention.

The reflective film 30 preferably has a reflectance of the laser light that is as high as possible. For example, a reflective sheet made of a metal film of aluminum, silver, or the like, or a reflective film with a high reflectance made of multilayer films is used as the reflective film 30 of the laser light. The multilayer reflective films are multilayer films formed by alternately stacking two kinds of dielectric films having different refractive indices. For example, multilayer films made of $Al_2O_3$ and $SiO_2$ are preferable because they are inexpensive and can exhibit reflectances of approximately 99% or more. These films can be easily deposited by an electron beam (EB) vapor deposition, an electron cyclotron resonance (ECR) sputtering, or the like. In another example, as shown in FIG. 5, the reflective films 30 can be obtained by depositing a single-crystal film 31 of aluminum and a multilayer film 32. The multilayer films 32 are formed by depositing one or more sets of layers, each set including, for example, two layers with different refractive indices which are deposited by a chemical vapor deposition (CVD) method, and more specifically, a $MgF_2$ layer and a $Sc_2O_3$ layer, each of which is deposited to have a thickness of $\lambda/(4n)$ (where n is a refractive index of the layer material, and $\lambda$ is a wavelength of the laser light). The single-crystal film 31 made of aluminum may be formed by adjusting the deposition conditions for the CVD method. Note that the above reflective sheet is preferably formed by depositing one or more dielectric films on a metal film. The reflective films 30 may be formed to have a thickness ranging from approximately 1 μm or more and 2.5 μm or less in total, and to have reflectances of 80% or more and more preferably 90% or more.

Figure 2A:
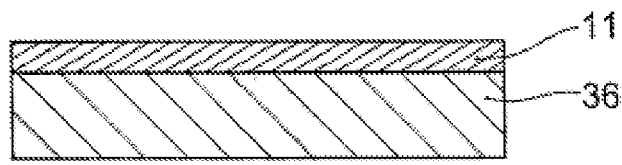
FIG. 2A is an explanatory view of one step in the method of manufacturing the deposition mask according to the embodiment of the present invention.

Next, referring to specific examples of FIGS. 2A to 2G, a method of manufacturing the deposition mask according to the present invention will be described in detail. First, as shown in FIG. 2A, the resin film 11 is formed on a support substrate 36. The resin film 11 may be formed by applying a liquid resin material to the support substrate 36. Examples of the liquid resin material include a polyimide (PI) resin, a polyethylene naphthalate (PEN) resin, a polyethylene terephthalate (PET) resin, a cycloolefin polymer (COP) resin, a cyclic olefin copolymer (COC) resin, a polycarbonate (PC) resin, polyamide resin, a polyamide-imide resin, a polyester resin, a polyethylene resin, a polivinyl alcohol resin, a polypropylene resin, a polystyrene resin, a polyacrylonitrile resin, an ethylene vinylacetate copolymer resin, an ethylene-vinyl alcohol copolymer resin, an ethylene-methacrylic acid copolymer resin, a polyvinyl chloride resin, a polyvinylidene chloride resin, and an ionomer resin. For example, the polyimide resin is preferable because, when the resin film is formed by applying a precursor solution and then performing heat treatment, the linear expansion coefficient of the resin film made of the polyimide resin can be adjusted depending on the condition including a temperature rise profile during the heat treatment, or the like. However, the resin film 11 is not limited to the above-mentioned type. Alternatively, the resin film in the form of a sheet may be attached to the support substrate 36. When the resin film 11 is produced by coating a liquid resin material, a uniform coating film can be formed by, for example, slit coating, spin coating or the like. The thickness of the resin film 11 is approximately several μm to several tens μm, for example, about 5 μm. When the resin film 11 is produced by applying a liquid resin material, for example, the applied resin material is heated to, for example, approximately 400° C. or higher and approximately 500° C. or lower. The linear expansion coefficient of the resin film 11 can be adjusted by regulating the heating condition. The support substrate 36 may be, for example, a glass substrate having a flat front surface. The resin film 11 preferably has a linear expansion coefficient close to that of the substrate for vapor deposition to be deposited when used as the deposition mask 10.

Figure 2B:
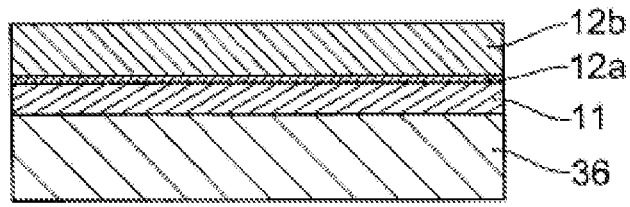
FIG. 2B is an explanatory view of one step in the method of manufacturing the deposition mask according to the embodiment of the present invention.
Figure 2C:
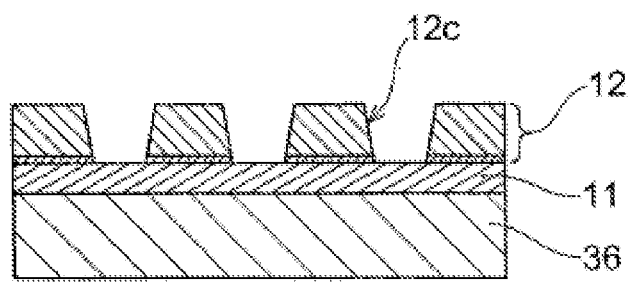
FIG. 2C is an explanatory view of one step in the method of manufacturing the deposition mask according to the embodiment of the present invention.

As illustrated in FIG. 2B, a seed layer 12a is formed on the resin film 11 through electroless plating so as to have a thickness of approximately 0.05 μm or more and 0.5 μm or less. Then, a metal film 12b is formed on the seed layer 12a through electrolytic plating by passing an electric current through the seed layer 12a. The metal film 12b will be patterned at a subsequent step to form a metal support layer 12, which serves to suppress warping of the resin film 11. The metal film 12b may be made of a metal material, such as Fe, Ni, a Fe—Ni alloy, invar, or the like and may have a thickness of 20 μm or more and 60 μm or less. The metal film 12b is preferably made of a magnetic substance, because a magnetic force can be used to closely fix the deposition mask 10 to the substrate for vapor deposition. It should be noted that the metal support layer 12 may be optional. Even when the metal support layer 12 is formed, the electrolytic plating is not necessarily used. Alternatively, the metal film 12b may be formed by a sputtering, vacuum deposition, or the like. Furthermore, alternatively the metal film 12b may be formed using a metal foil. Even when the metal film 12b is formed by plating, the seed layer 12a is not necessarily formed by electroless plating. Alternatively, the seed layer 12a may be formed by the sputtering, vacuum deposition, or the like.

Figure 8A:
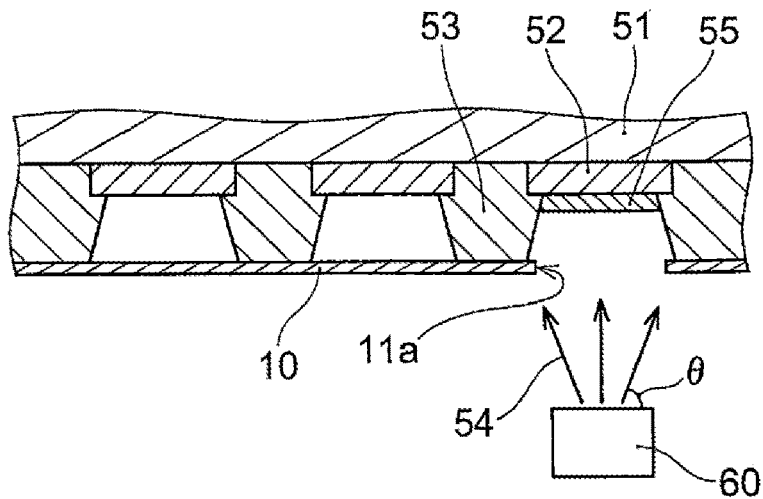
FIG. 8A is an explanatory view showing a vapor deposition process in the case of manufacturing an organic EL display apparatus according to an embodiment of the present invention.

Then, both the metal film 12b and the seed layer 12a are patterned to form opening holes 12c, each of which is slightly larger than the opening portion 11a. That is, the metal film 12b and the seed layer 12a are formed to avoid at least the formation region of the opening portion 11a in the resin film 11. For example, a tapered opening hole 12c shown in the figure is formed by providing a resist film (not shown) on the metal support layer 12 and performing isotropic etching via the resist film. The reason why the opening hole 12c is formed to have the tapered shape is as follows. That is, as shown in FIG. 8A, an organic material 54 is flying from the vapor deposition source 60 in a wrapper-like bundle (referred to as vapor deposition beams) with a constant angle θ (a vapor deposition angle) of the vapor deposition source 60. This is because particles of the vapor deposition at the side edges of the bundle of the vapor deposition beams also reach to the substrate for vapor deposition without being blocked. Strictly speaking, when θ in FIG. 8A is a vapor deposition angle, an taper angle (an acute angle formed relative to the bottom surface of the taper) of the mask is preferably equal to or less than the vapor deposition angle θ. However, when the opening hole 12c is sufficiently larger than the opening portion 11a of the resin film 11, the opening hole 12c may be formed with an arbitrary taper angle. Alternatively, the opening hole 12c may be formed without such etching, for example, by providing a resist film on the portions where the opening holes 12c are to be formed, in the step of FIG. 2B, to prevent electrolytic plating, or performing sputtering or the like by a lift-off method. The metal support layer 12 may be formed on the entire surface around the opening portions 11a of the resin film 11, or may be formed in a post shape around each opening portion 11a. The opening holes 12c may be formed in a slit shape.

Figure 2D:
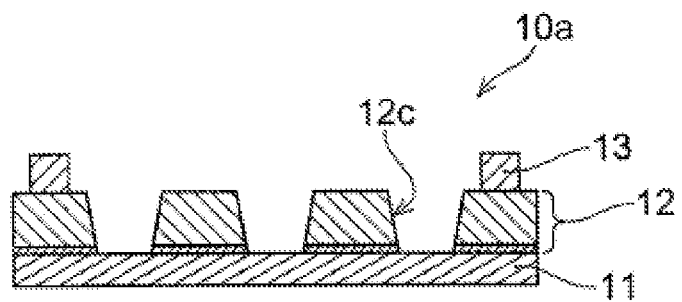
FIG. 2D is an explanatory view of one step in the method of manufacturing the deposition mask according to the embodiment of the present invention.

Then, the resin film 11 is peeled off from the the support substrate 36, and as shown in FIG. 2D, the resin film 11 is stretched and fixed to the frame 13, thereby producing a resin film assembly 10a. This stretching of the resin film 11 is performed because, if the resin film 11 is loosely fixed to the frame 13, the opening portions 11a are formed with the inaccurate size. Due to this, as long as the resin film 11 is constantly in a stretched state, this stretching step is not necessarily performed, and the resin film 11 only may be just attached to the frame 13. The frame (frame body) 13 is, for example, required to have enough stiffness to withstand tension when the tension is applied thereto. A metal plate having a thickness of 25 mm or more and 50 mm or less is used as the frame 13. The frame 13 may not be used unless necessary. However, using the frame 13 is preferred in terms of handleability of the resin film assembly 10a. In the presence of the metal support layer 12, the frame 13 may be fixed to the metal support layer 12 by laser welding or the like in a stretched state with respect to the resin film 11. On the other hand, in the absence of the metal support layer 12, the frame 13 may be bonded directly to the resin film 11 with an adhesive or the like. In this case, the adhesive is preferably used, which does not generate any gas during vapor deposition. For example, a fully cured adhesive such as an epoxy resin is preferable as the adhesive. Even when the tension is barely applied to the resin film 11 (which means the resin film 11 is not stretched), from the viewpoint of a certain degree of mechanical strength and handleability, the frame 13 is preferably provided which is made of, for example, a metal plate or plastic plate that has a thickness of 10 mm or more and 30 mm or less. If the frame 13 is a metal plate having a magnetic property, the frame 13 can be easily fixed to the substrate for vapor deposition using any magnet even when the metal support layer 12 is not provided.

Figure 2E:
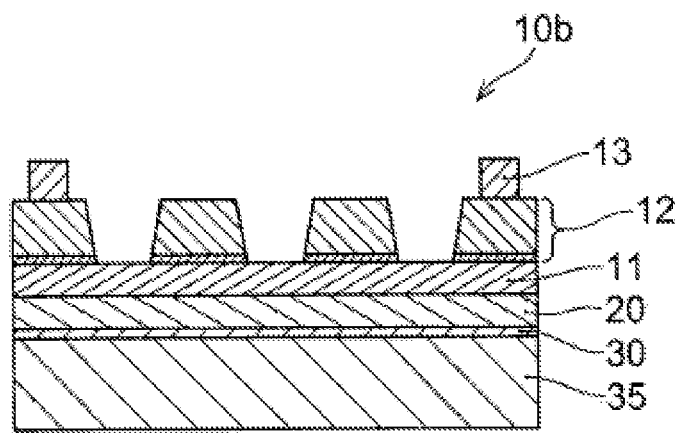
FIG. 2E is an explanatory view of one step in the method of manufacturing the deposition mask according to the embodiment of the present invention.

Then, as shown in FIG. 2E, the resin film 11 is fixed to a process stage 35. At this time, the close contact layer 20 and the reflective film 30 are interposed between the resin film 11 and the process stage 35. As described above, the close contact layer 20 may or may not be present, but is preferably inserted between the resin film 11 and the process stage 35 because it is preferable that an air layer is not interposed between the resin film 11 and the reflective film 30. For this reason, preferably, the close contact layer 20 is in contact with the resin film 11 and further with the reflective film 30. For example, the reflective film 30 made of multilayer films of $Al_2O_3$ and $SiO_2$ or a metal sheet may be formed on the process stage 35 shown in FIG. 5. Subsequently, the close contact layer 20 made of, for example, a resin film in the film or liquid layer, may be formed on the reflective film 30. Then, the resin film assembly 10a shown in FIG. 2D (or a resin film assembly (not shown) stretched and fixed to a frame) may be provided on the close contact layer 20 so that the side of the resin film 11 is in contact with the close contact layer 20. In these ways, the mask member 10b may be formed. However, the resin film 11 does not need to be in perfect contact with the close contact layer 20. Alternatively, the resin film assembly 10a may be simply overlaid on the close contact layer 20, for example, made of PVAC, PVP or the like or may be adhered to the close contact layer 20 with a dissoluble adhesive that does not erode the resin film 11 so that the resin film 11 is separable from the close contact layer 20. Forming the reflective film 30 on the process stage 35 in this manner makes it possible to continuously use the reflective film 30 only by re-forming the close contact layer 20 even when the resin film 11 is replaced with another after the process, which does not lead to an increase in cost.

In the resin film assembly 10a (the metal support layer 12 is omissible), as illustrated in FIG. 2D, the close contact layer 20 may be formed directly on the back surface (that is opposite to a surface on which the metal support layer 12 is formed) of the resin film 11 by the CVD method, vacuum deposition, or the like. Meanwhile, the reflective film 30 may be formed on the above process stage 35. Then, the resin film assembly 10a in which the close contact layer 20 is formed may be fixed to the reflective film 30. In this case, the close contact layer 20 may be formed of any material that enables separation from the resin film 11 without damaging the resin film 11. In particular, the close contact layer 20 may be formed by an inorganic dielectric film, which is made of $SiO_2$, $Si_3N_4$, or the like, using a CVD method or the like. In this way, a mask member 10b for the deposition mask is obtained. It should be noted that the close contact layer 20 may be formed on the surface of the reflective film 30 disposed on the process stage 35 and may not be concurrently formed on the resin film 11. Furthermore, the reflective film 30 may be formed of the above-mentioned dielectric multilayer films 32 on the close contact layer 20 However, the reflective film 30 is discarded together with the close contact layer 20 after every processing of the resin film 11, which is disadvantageous in terms of cost. In other words, the mask member 10b may be adhered to the process stage 35. The reflective film 30 side of the mask member 10b may be fixed to an appropriate process stage by an adhesive or the like.

Alternatively, when a liquid layer made of ethanol or the like is used as the close contact layer 20, for example, the reflective film 30 may be formed on the process stage 35, the liquid layer made of ethanol may be formed on the reflective film 30, and a resin film assembly 10a may be placed on the liquid layer.

Figure 2F:
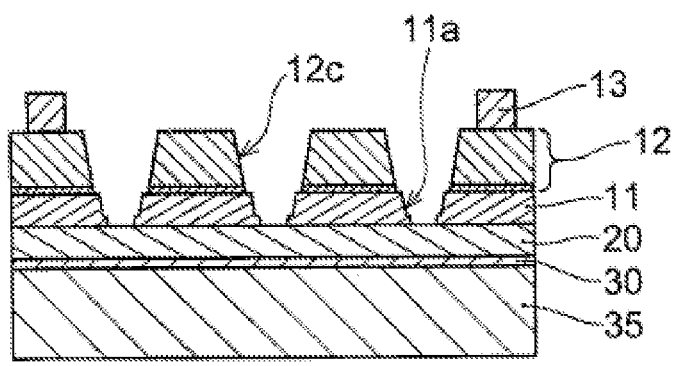
FIG. 2F is an explanatory view of one step in the method of manufacturing the deposition mask according to the embodiment of the present invention.
Figure 7A:
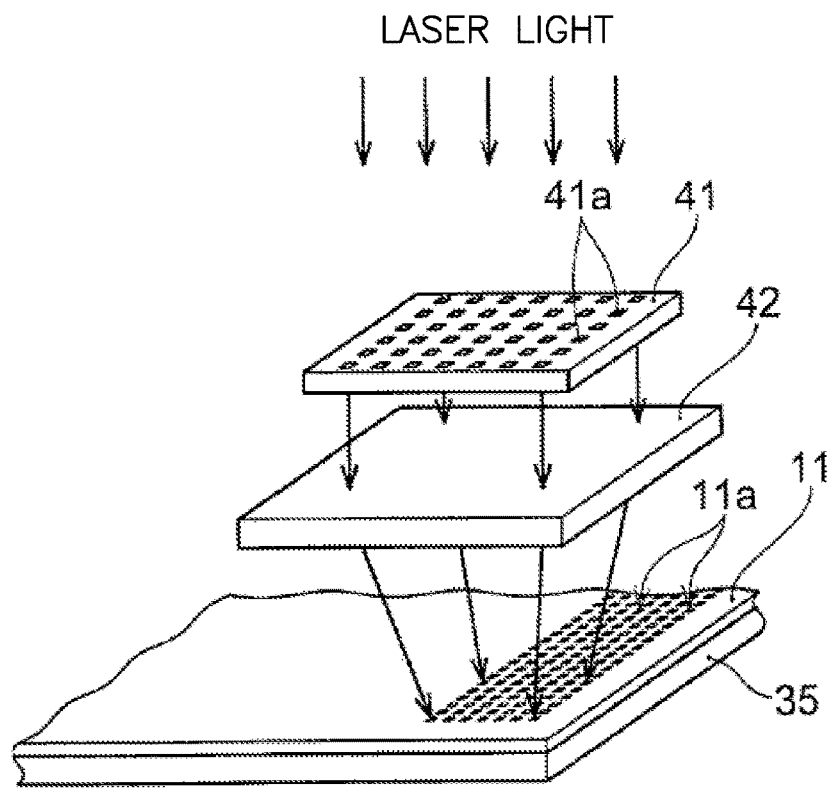
FIG. 7A is an explanatory view seen when opening portions are formed in the deposition mask by irradiation with a laser light.

Then, as shown in FIG. 2F, opening portions 11a are formed in the resin film 11. For example, as shown in FIG. 7A, when forming the opening portions 11a, the resin film 11 is irradiated with the laser light from its front surface side (a side opposite to the process stage 35) via a laser mask 41 with a desired pattern of optical opening portions 41a and the optical lens 42, whereby the pattern of the opening portions 41a on the laser mask 41 is scaled down and transferred to the resin film 11. This laser light irradiation apparatus and the resin film 11 are relatively moved using a stepper, so that the pattern of the opening portions 11a is sequentially formed in the large resin film 11. The optical lens 42 is not necessarily required, but is effective in increasing an irradiation energy density of a processed surface. In this case, the optical lens 42 is disposed on the downstream side in the traveling direction of the laser light (on one side of the resin film 11) with respect to the laser mask 41. The optical lens 42 is designed to condense the laser light. For example, the use of a 10× optical lens 42 results in 100-fold energy density, but one side of the pattern is transferred from the laser mask 41 onto the resin film 11 on a scale of 1/10. By such irradiation with the laser light, the laser light transmitted through the opening portions 41a on the laser mask 41 sublimes parts of the resin film 11. As a result, in conformity with the pattern of the opening portions 41a of the laser mask 41 irradiated with the laser light, the fine pattern of the opening portions 11a is formed on the resin film 11. This fine pattern in the resin film 11 is the same as or reduced in size as the pattern on the laser mask 41. At this time, in the present invention, the reflective film 30 is provided on the opposite side of the resin film 11 to the side facing the laser light source (although omitted in FIG. 7A), the laser light transmitted through the parts of the resin film 11 which become thinner by sublimation is reflected by the reflective film 30 and then returns back to the resin film 11. Eventually, as described above, sublimation progresses from the back surface side of the resin film 11 as well, thereby preventing a part of the resin from remaining as a burr on the back surface of the resin film 11.

Figure 7B:
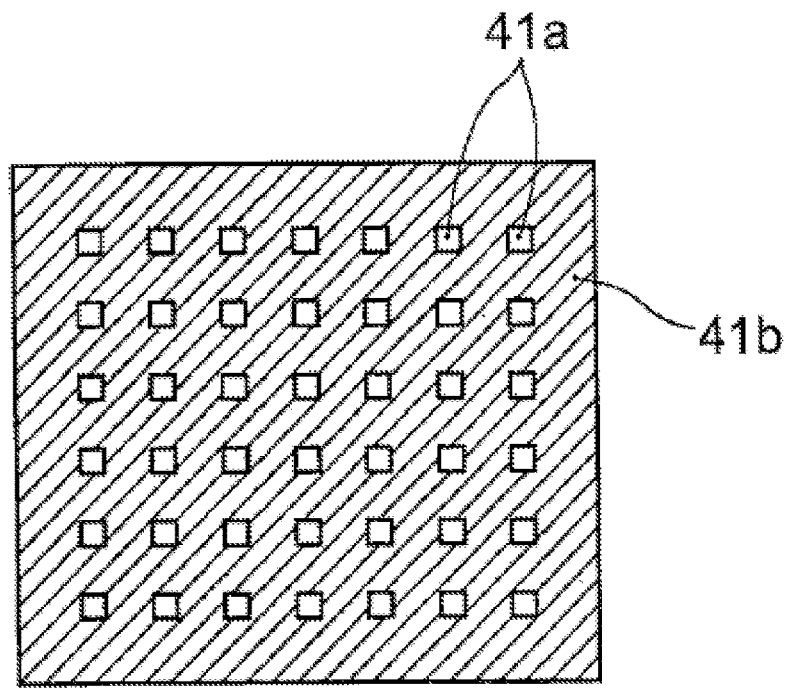
FIG. 7B is an explanatory view seen when the opening portions are formed in the deposition mask by irradiation with the laser light.
Figure 7C:
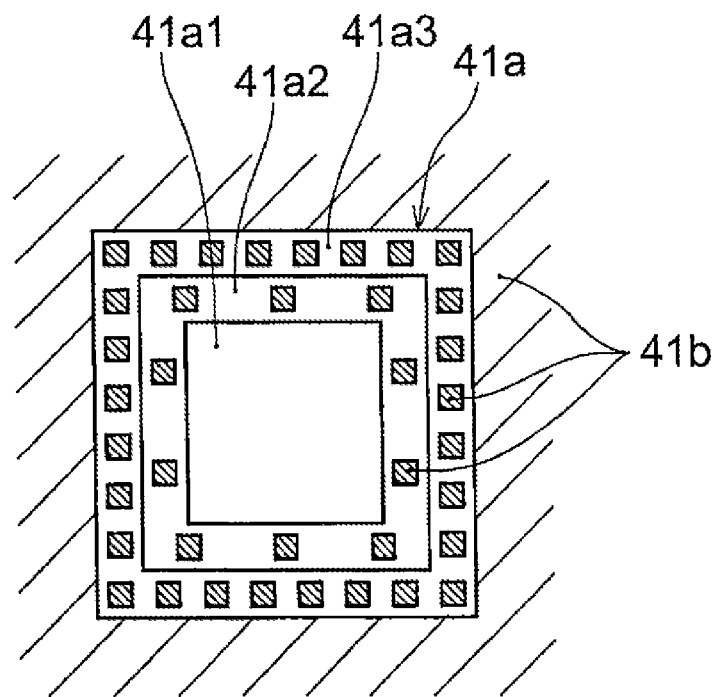
FIG. 7C is an explanatory view seen when the opening portions are formed in the deposition mask by irradiation with the laser light.
Figure 7D:
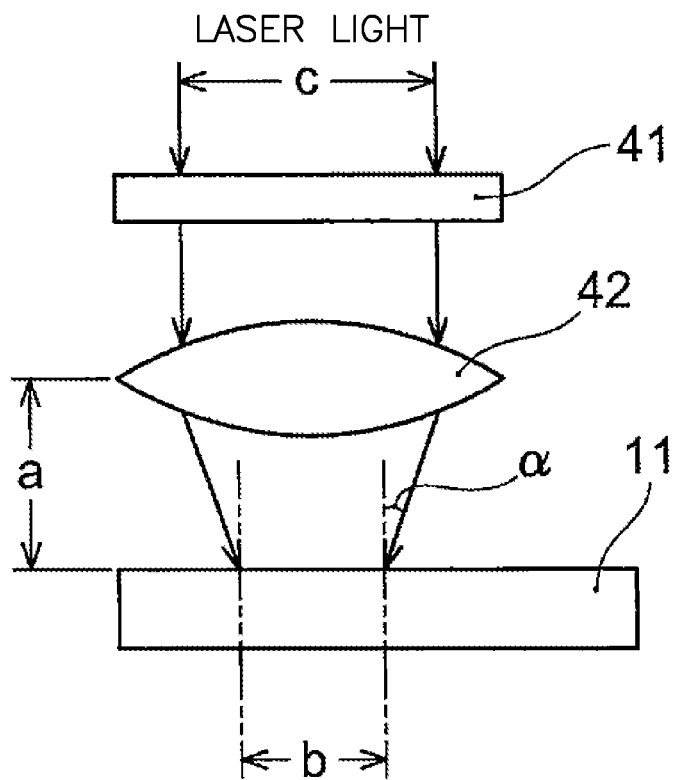
FIG. 7D is an explanatory diagram of a state of refracted light by an optical lens for the laser light.

As described above, when using the 10× optical lens 42, as shown in FIG. 7D, the parallel light rays from the laser light source pass through the laser mask 41 and then through the optical lens (convex lens) 42, and are converged onto the resin film 11 on a scale of 1/10, thereby allowing the resin film 11 to be irradiated. The light at the center of the laser light is incident on the resin film 11 almost vertically (at an incident angle of approximately 0°). Meanwhile, an incident angle α of the outermost light ray becomes larger. Here, the incident angle α of the light ray located at the end of the light bundle, which is the largest incident angle, is considered. Assuming that at this time, a is a distance between the optical lens 42 and the resin film 11, b is a length of one side of an optical image formed by the convergent laser light, c is one side of a bundle of the laser light rays before entering the optical lens 42, and the laser light is converged to become 1/10 of the original size, for b=4 mm and a=30 mm, the relationship of c=10b=40 mm is given, and consequently, tan α=(c/2−b/2)/a=18/30=0.6. Therefore, α is determined to be 31° (α=31°). This angle is an incident angle of the outermost light ray, and incident angles of other light rays located on the central side become smaller than this incident angle. In addition, since the material of the resin film 11 has a refractive index n that is greater than a refractive index (approximately 1) of air, when the laser light enter the resin film 11, the laser light is reflected to be oriented in the direction closer to the vertical direction relative to the resin film. That is, according to Snell's law, a refraction angle β (see FIG. 7E) satisfies sin β=sin α/n, and when the refractive index n of the resin film 11 is 1.5, the formula of sin β=sin 31°/1.5 is obtained. Therefore, β is approximately 20°. If a material that has a refractive index larger than that of the resin film 11 is used for the close contact layer 20, the incident angle to a reflecting surface of the close contact layer 20 becomes smaller. Conversely, if a material that has a refractive index smaller than that of the resin film 11 is used for the close contact layer 20, the incident angle to the reflecting surface of the close contact layer 20, which is the same as the reflection angle therefrom, becomes larger, whereby the reflected light reaches a distant position. As the thickness of the close contact layer 20 increases, a distance d between a position on the front surface of the resin film 11 where the incident light enters and another position on the front surface of the resin film 11 where the reflected light returns to reach.

Figure 7E:
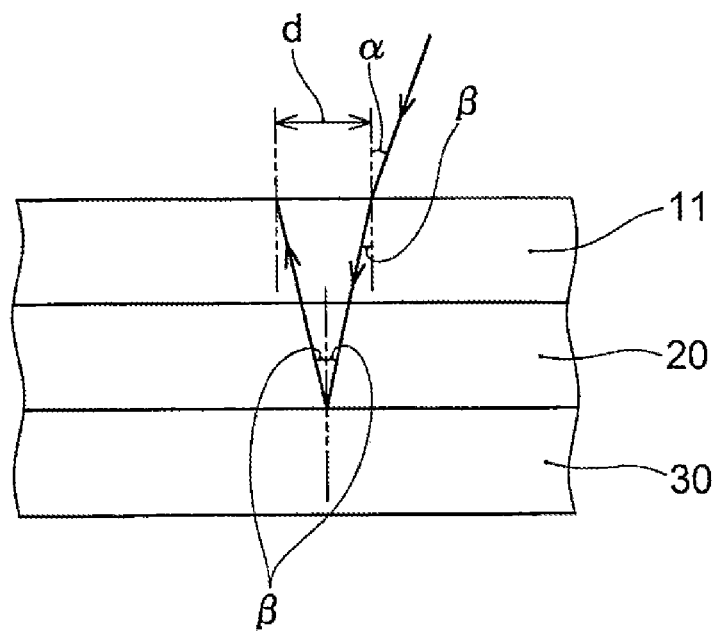
FIG. 7E is an explanatory diagram of a state of a light ray obtained by reflection of the refracted laser light on the reflective film.

A deviation of the point of the resin film 11 where the reflected light reaches due to the diagonal incidence will be considered. It is assumed that the refractive index of the close contact layer 20 is the same as the refractive index of the resin film 11 for convenience, and the total thickness of the resin film 11 and the close contact layer 20 is 10 μm for convenience (which is actually smaller than this). In this case, as shown in FIG. 7E, the reflection angle of the reflected light, which is reflected by the reflective film 30, is the same as the refraction angle β, and the above-mentioned distance d between the position of the incident light and the position of the reflected light is determined to be d=20 tan β=7.28. That is, for example, assuming that each opening portion is about 30 μm square (opening portions, each of which is 30 μm square, are formed at intervals of 30 μm within an optical image of 4 mm square formed on the resin film 11 described above), the resin film 11 is re-irradiated with the reflected light at a position that deviates by approximately 7.28 μm from the opening portion of approximately 30 μm in length per side. This deviation is caused when the incident angle is at the maximum, but is smaller in practice, so the deviation becomes much smaller. Therefore, it is considered that most of the incident light is incident in a state where the incident angle is almost 0°, and the reflected light returns to an area where it does not spread so much. In addition, a slight deviation of the reflected light from the incident light is more advantageous from the viewpoint of re-irradiation from the back surface side. That is, it is considered that the cause of the residual resin is due to the presence of a weak part of the laser light. Thus, when reflected directly above, the weak laser light is reflected as it is, and then the resin film is re-irradiated with the weak light, whereas the light reflected diagonally may have a possibility of a strong laser light, and then the resin film may be re-irradiated with the strong light.

Figure 7F:
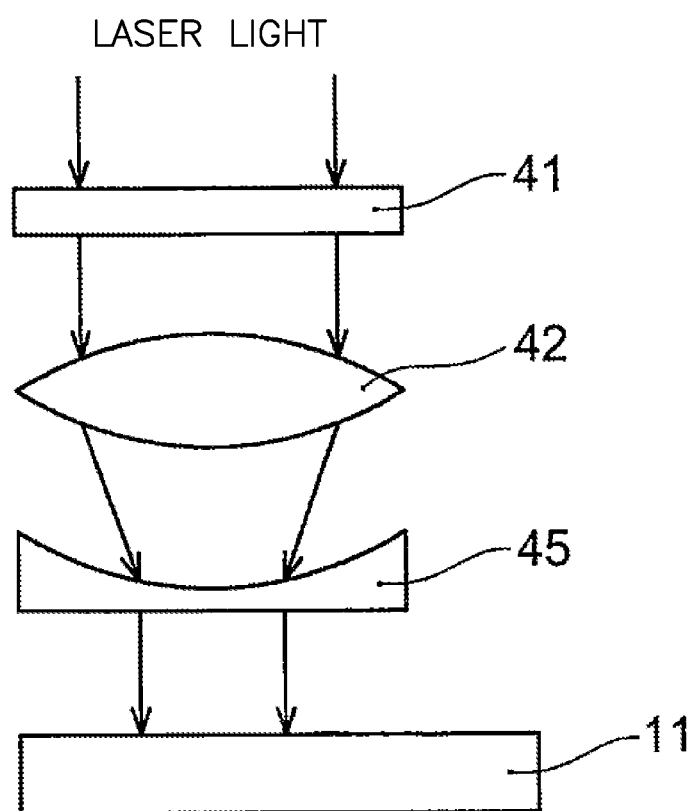
FIG. 7F is an explanatory diagram showing a state in which the refracted light is collimated into parallel light rays by an optical lens for the laser light.

However, as shown in FIG. 7F, a collimating lens 45 is interposed between the optical lens 42 and the resin film 11, so that the laser light can be collimated into substantially parallel light rays, which are incident parallel on the resin film 11 and reflected parallel by the reflective film 30. By adjusting the incident angle relative to the resin film 11 to 0° in this manner, the light can constantly be reflected directly above as long as the close contact layer 20 is parallel to the resin film 11 regardless of the refractive index of the close contact layer 20, even if any air layer is interposed therebetween. FIG. 7F is the same as FIG. 7D except for the collimating lens 45, and thus a description thereof is omitted.

The conditions for irradiation with the laser light are adjusted depending on the materials and thicknesses of the resin films 11 to be processed, the size and shapes of the opening portions 11a to be processed, or the like. However, in general, the irradiation with the laser light is performed under the following conditions: the pulse frequency of the laser light is 1 Hz or more and 60 Hz or less; the pulse width is 1 nanosecond (nsec) or more and 15 nanoseconds or less; and the energy density of the laser light on an irradiation surface per pulse is 0.01 J/cm$^2$ or more and 1 J/cm$^2$ or less.

For example, in order to form the deposition mask 10 to be used when depositing organic layers in an organic EL display apparatus, the resin film 11 made of polyimide is irradiated with the laser light under the conditions below. For example, the resin film 11 has opening portions of 30 μm square, which are arranged at intervals of approximately 30 μm in a matrix manner. The wavelength of the laser light is 355 nm (which is a third harmonic of YAG laser). The pulse frequency thereof is 60 Hz. The pulse width thereof ranges from several nanoseconds or more and 20 nsec or less. The energy density of the laser light on the irradiated surface is 0.25 J/cm$^2$ or more and 0.45 J/cm$^2$ or less per pulse. The number of shots (the number of irradiated pules) is 50 and more and 200 or less.

However, the laser light used for the irradiation is not limited to light from a YAG laser. Thus, any other laser may be used as long as it emits a light with a wavelength that can be absorbed in the resin. Therefore, other laser lights, such as an excimer laser, a He—Cd laser and the like may be used. It is needless to say that when the laser light source is changed or the resin material is changed to another, the irradiation conditions are to be modified according to them. In the above-mentioned example, 100 shots of irradiation with the laser light were performed to form the pattern of the opening portions. However, about 100 shots of irradiation can form through holes in a polyimide film having a thickness of 10 μm.

It should be noted that also in FIG. 2F and the subsequent figures, as the opening portion 11a is illustrated exaggeratedly to be formed in a tapered shape, a size of the opening portion 11a (a size of the opening portion 11a on the side of the close contact layer 20) is illustrated to be small. However, in practice, the length of one side of the opening portion 11a is substantially the same as the distance between the adjacent opening portions 11a. The reason why the opening portion 11a is formed in a tapered shape is the same as the reason why the opening hole 12c of the metal support layer 12 mentioned above is formed in a tapered shape. Specifically, the reason is that since vapor deposition material evaporated from the vapor deposition source becomes deposition beams having a sector-shaped in cross section with a certain angle, which shape is determined depending on a shape of a crucible of the vapor deposition source, such a tapered opening portion 11a enables even the particles of the vapor deposition located at side edges of the deposition beams to be deposited on a desired site of the substrate for vapor deposition without being blocked. In the example shown in FIG. 2F, each opening portion 11a is formed to have two steps in order to more reliably eliminate the blocking of the particles of the vapor deposition. These two steps are formed in the opening portion 11a by performing irradiation with laser light in two sessions. For example, initially, the resin material in the resin film 11 is sublimed up to approximately a half of a thickness of the resin film 11 and at an area larger than a desired opening portion. Then, the remaining resin film 11 is irradiated with the laser light again using a laser mask 41 having the same size opening pattern as the desired opening portion to form each opening portion 11a in the two steps. The opening portion 11a of the tapered shape may be obtained by differentiating the transmittance of the laser mask 41 for the laser light at the center portion of each opening portion 41a and at its peripheral portion.

That is, the above-mentioned laser mask 41 is formed, for example, as follows. As shown in FIG. 7B, a light-shielding thin film 41b made of chromium or the like is formed on a transparent substrate that transmits the laser light, such as a quartz glass plate. Thereafter, the light-shielding thin film 41b is patterned to form opening portions 41a. Consequently, a transmittance of the laser mask 41 can be partly changed by forming the light-shielding thin films 41b in a spot manner, for example, as conceptually shown in FIG. 7C. In FIG. 7C, each opening portion 41a is illustrated to be partitioned into a first section 41a1, a second section 41a2, and a third section 41a3 for convenience, but such partitioning is not necessarily performed. The first section 41a1 transmits 100% of light because the light-shielding thin film 41b is not formed in the first section 41a1 at all. In the second section 41a2, the light-shielding thin films 41b are sparsely formed, so that an area of the total light-shielding thin films 41b is approximately 20% of the entire area of the second section 41a2. Consequently, the second section 41a2 has a transmittance of 80%. Further, the third section 41a3 is formed so that the amount of the light-shielding thin films 41b is approximately 50% of the entire area of the third section 41a3 in terms of area. Consequently, the third section 41a3 has a transmittance of approximately 50%. By forming the laser mask 41 such that its transmittance drastically changes toward its peripheral edge, the taper angle of the opening portion 11a becomes larger, whereas by forming the laser mask 41 such that its transmittance changes moderately, the taper angle of the opening portion 11a becomes smaller and thereby the opening portion 11a is tapered gradually.

In this example, for easy understanding of the description, the opening portion 41a is described as being divided into the first section 41a1, the second section 41a2, and the third section 41a3, and the light-shielding thin films 41b are illustrated to be distributed in a plurality of regions in the figure. However, since a transfer resolution of the laser light is actually approximately 2 μm, for example, the opening portion is, in practice, partitioned into 5 by 5 equal segments in the vertical and horizontal orientations, respectively, each segment having 2 μm square, resulting in 25 segments in total. The light-shielding thin film 41b is formed in some of all 25 segments, thereby making it possible to adjust the transmittance of the laser light. As such, by continuously reducing the transmittance of the opening portion 41a toward its peripheral edge, the tapered opening portion 11a can be formed.

That is, the above-mentioned method illustrated in FIG. 7C or adjustment using a projection lens (optical lens 42) or the like allows the transmittance of each opening portion 41a for the laser light to gradually decrease from its center to peripheral edge. This makes the laser light incident on the resin film 11 weaker toward the peripheral edge, thus reducing an ability of sublimating the resin film 11. Consequently, the amount of the resin film 11 removed from its front surface side becomes small at its peripheral edge, whereby the opening portion 11a is formed in the tapered shape.

Figure 2G:
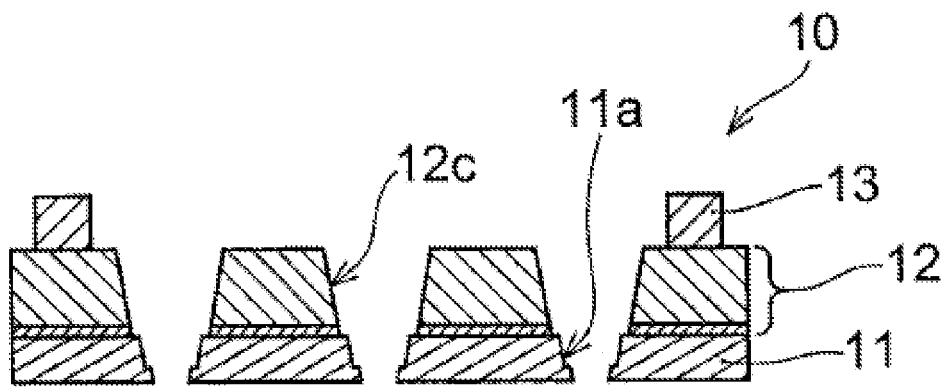
FIG. 2G is an explanatory view of one step in the method of manufacturing the deposition mask according to the embodiment of the present invention.

Thereafter, the close contact layer 20, the reflective film 30, and the process stage 35 are removed as shown in FIG. 2G. In this way, the deposition mask 10 is obtained. When the close contact layer 20 and the reflective film 30 are pressed against and fixed firmly to the process stage 35, the deposition mask 10 is separated from the process state 35 by simply pulling the frame 13 fixed to the resin film 11. If the close contact layer 20 is made of a resist material, for example, it may be subjected to an ashing process for dissolution of an organic substance contained in the close contact layer 20 with an asher or the like, or the close contact layer 20 may be immersed into a resist removing liquid. In this way, the close contact layer 20 can be removed from the resin film 11 without any damage to the resin film 11. If the close contact layer 20 is an inorganic dielectric film made of a silicon oxide film or the like, an etchant, such as dilute hydrofluoric acid, which does not erode a resin film, may be used to dissolve and remove the close contact layer 20. Consequently, the deposition mask 10 and the close contact layer 20, and the like can be easily separated from each other, thereby producing the deposition mask 10. Thereafter, the deposition mask 10 is put in an organic film cleaning liquid, for example, "OEL Clean-01", manufactured by KANTO CHEMICAL CO., INC., within an ultrasonic bath and cleaned at a frequency of 80 kHz with a power of 0.5 W/cm² for 10 minutes.

In the above method, deposition masks 10 were respectively manufactured using PVAC as the close contact layer 20 and also using the above-mentioned dielectric multilayered reflective films (Example 1) and the above-mentioned metal sheet (Example 2) as the reflective film 30, and 2016 opening portions are formed in each of the deposition masks 10. The number of burrs formed at these opening portions was checked by observing each of the resin film 11 from its backside (surface opposite to the surface with the metal support layer 12 formed thereon) with a microscopy. This observation was performed by photographing 42 blocks, each block having 6×8 slots (opening portions). The results are summarized in Table 1 in comparison with deposition masks using polyvinyl alcohol (PVA) (Comparative Example 1) and ethanol (Comparative Example 2) as protective layers, each of Comparative Examples having the conventional structure shown in FIG. 10. This comparison was made in terms of the number of burrs counted in the same manner as Examples. Furthermore, another comparison between Examples and Comparative Examples with the same structures as mentioned above was made in terms of the number of burrs observed and counted from the side of the metal support layer 12. The results are summarized in Table 2. The number of burrs which was observed from a side of the resin film 11 is different from that observed from a side of the metal support layer 12. The reason for the different numbers is considered that foreign particles that had been scattered and attached to the opening portions 11a during the laser processing were not completely removed even with washing and left as burrs.

TABLE 1

Status of generation of burrs
(observed from resin film side)

|  |  | Number of burrs | Generation rate (%) |
| --- | --- | --- | --- |
| Example 1 | Multilayer reflective film | 5 | 0.25 |
| Example 2 | Metal sheet | 8 | 0.4 |
| Comparative Example 1 | PVA | 23 | 1.1 |
| Comparative Example 2 | Ethanol | 136 | 6.7 |

TABLE 2

Status of generation of burrs
(observed from metal support layer side)

|  |  | Number of burrs | Generation rate (%) |
| --- | --- | --- | --- |
| Example 1 | Multilayer reflective films | 3 | 0.15 |
| Example 2 | Metal sheet | 10 | 0.5 |
| Comparative Example 1 | PVA | 25 | 1.2 |
| Comparative Example 2 | Ethanol | 140 | 6.9 |

Figure 4A:
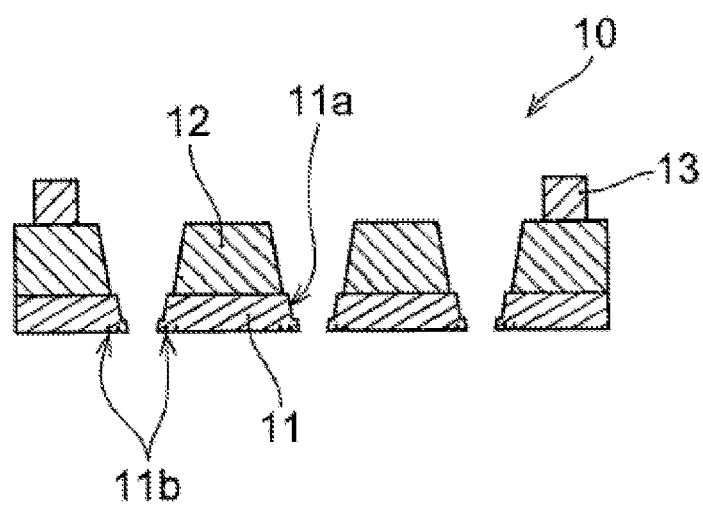
FIG. 4A is an explanatory view showing the cross section of the deposition mask according to the embodiment of the present invention.
Figure 6:
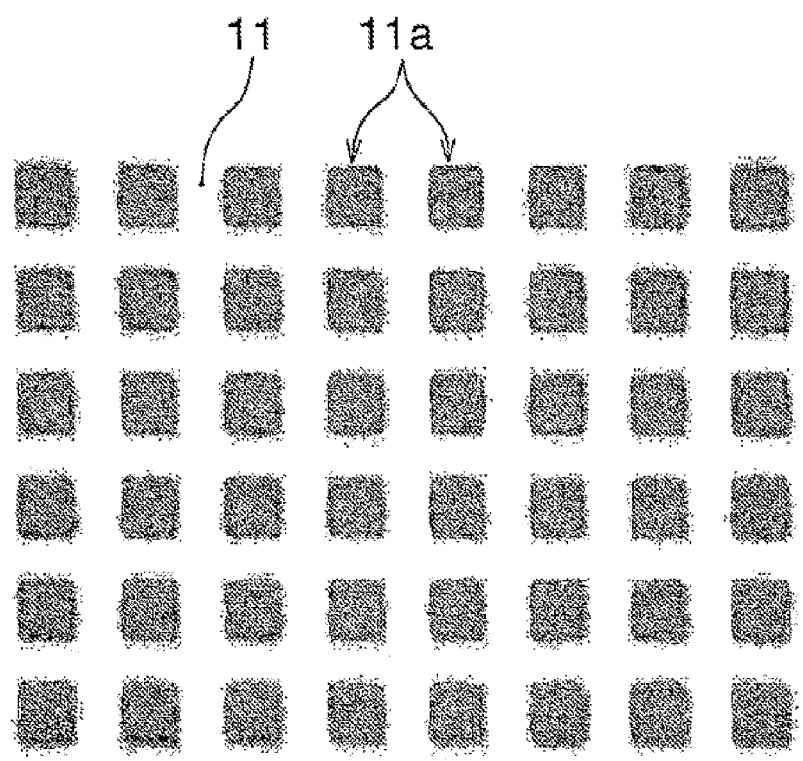
FIG. 6 is a picture of a deposition mask of Example 1 as viewed from the back surface side of a resin film.

As can be seen apparently from Tables 1 and 2, the forming of the reflective film 30 contributes to an approximately single-digit improvement in the generation rate of burrs in comparison with the conventional samples. FIG. 6 is a picture showing a state of the back surface of the resin film 11 in Example 1. As can be seen from this picture, the surface state is quite different from those in FIGS. 9B and 9C mentioned above, which shows that burrs and foreign particles are hardly left in Example 1. It should be noted that laser marks 11b shown in FIG. 4A are difficult to find in the picture (see FIG. 4A) to be described later, because each laser mark 11b has a depth of only about 0.3 μm or less (approximately 0.1 μm) and thus is too shallow to emerge in the picture.

According to the embodiment of the present invention, when the opening portions 11a are formed in the resin film 11, as the reflective film 30 is formed on the back surface side of the resin film 11, thus it contributes to the sublimation of the resin film 11 by using the reflected light. As a result, burrs that tend to be left on the back surface of the resin film 11 can be effectively removed. In addition, since the reflected light of the laser light is used, a laser light from the back surface increases the intensity light together with the sublimation of resin from parts of the resin film 11, unlike a case of irradiating a back surface of the resin film with laser light from another separate light source. That is, when the resin film 11 is sublimated or scattered, the transmission light of the laser light becomes large and the reflection light becomes large. As a result, the laser light is irradiated from the back surface side of the resin film 11 in a state where the resin in the front surface side is reduced, and the sublimated resin is easily emitted from the front surface side. In other words, when the most of the front surface of the resin film 11 is left, the laser light that strikes the back surface of the resin film 11 does not facilitate the sublimation of the resin from the front surface. In the embodiment of the present invention, no reflected light is generated when most of the resin is left on the front surface. In this case, most of the laser light is almost absorbed in the resin film 11 from the front surface and does not reach the reflective film 30. In short, the laser light strikes the back surface of the resin film 11 only at a necessary timing. This effectively removes unnecessary burrs.

Figure 3A:
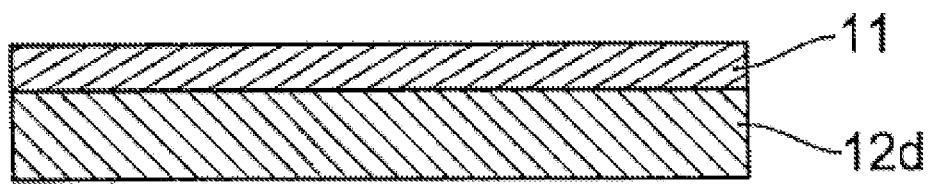
FIG. 3A is an explanatory view of one step in the method of manufacturing a deposition mask according to another embodiment of the present invention.

Next, with reference to FIGS. 3A to 3D, a description will be given below of a method of manufacturing a deposition mask according to another embodiment of the present invention. In this embodiment, the order of forming films is opposite to that in the foregoing embodiment. More specifically, as illustrated in FIG. 3A, a resin film 11 is formed on a metal foil 12d, which will be used as a metal support layer 12. The resin film 11 may be formed by applying a liquid resin to the metal foil 12d and heating and solidifying the liquid resin, similar to the foregoing embodiment, or by bonding a solidified film sheet to the metal foil 12d. This process can form, in a short time, an assembly in which the resin film 11 is in contact with the metal foil 12d without using plating.

Figure 3B:
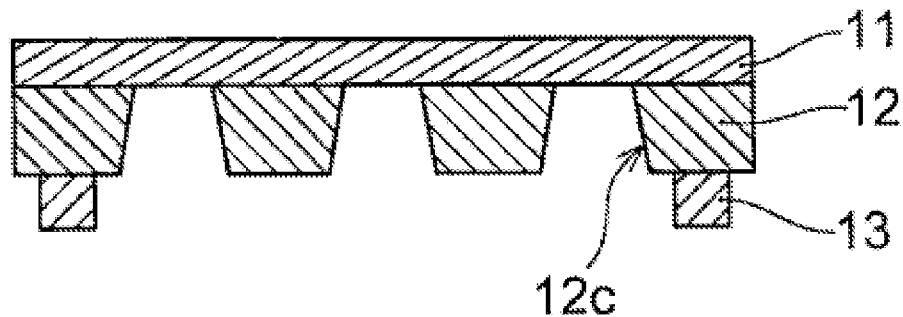
FIG. 3B is an explanatory view of one step in the method of manufacturing the deposition mask according to the another embodiment of the present invention.

As illustrated in FIG. 3B, the metal foil 12d is patterned, and then the resin film 11 is expanded and fixed to a frame 13. The reasons why the metal foil 12d is patterned and the resin film 11 is expanded are the same as those described in the foregoing embodiment. The material for the frame 13 may be the same as that used in the foregoing embodiment.

Figure 3C:
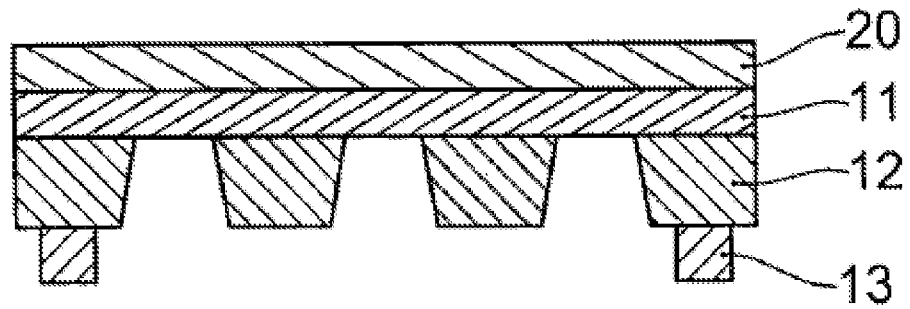
FIG. 3C is an explanatory view of one step in the method of manufacturing the deposition mask according to the another embodiment of the present invention.

As illustrated in FIG. 3C, a close contact layer 20 is formed on the resin film 11. The close contact layer 20 may be formed of an inorganic dielectric layer or other film that is easily separable from the resin film 11 by a CVD method or the like, for example, similar to the foregoing embodiment.

Figure 3D:
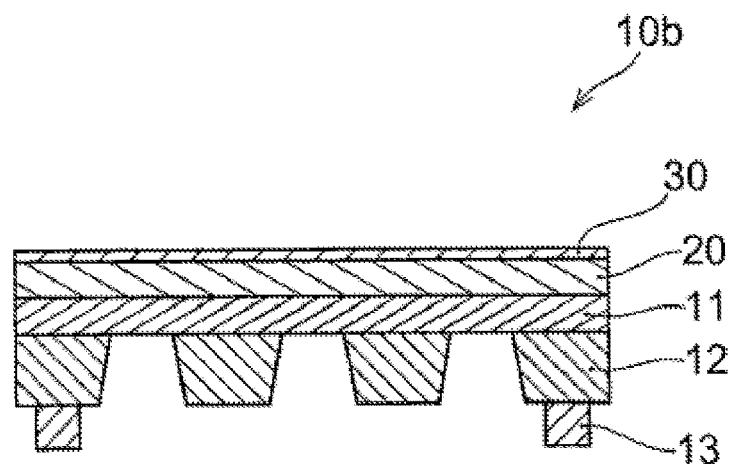
FIG. 3D is an explanatory view of one step in the method of manufacturing the deposition mask according to the another embodiment of the present invention.

As illustrated in FIG. 3D, a reflective film 30 is formed on the close contact layer 20 by a CVD method or the like. The reflective film 30 may have the same structure as that described in FIG. 5. First, multilayer films 32 (see FIG. 5) are formed, and then an aluminum single-crystal film 31 is formed. In this way, a mask member 10b for a deposition mask 10 is obtained, as illustrated in FIG. 3D. In this example, as described above, the assembly illustrated in FIG. 3B or 3C may be stacked on the reflective film 30 or the close contact layer 20 that has already been formed on a process stage 35, thereby forming the mask member 10b.

As illustrated in FIG. 2E, the reflective film 30 of the mask member 10b is fixed to the process stage 35, thereafter. This fixing is performed using an adhesive agent or with another method by which the reflective film 30 is fixed to the process stage 35 to an extent that the reflective film 30 does not move. Then, as illustrated in FIGS. 2F to 2G, a pattern of opening portions 11a is formed in the resin film 11 with laser light. After that, the close contact layer 20 is removed from the resin film 11 so that the resin film 11 is separated from the process stage 35 or the like. In this way, the deposition mask 10 is obtained.

FIG. 4A illustrates a cross section of the deposition mask 10 manufactured by the above method. This structure is substantially the same as that illustrated in FIG. 2G, but FIG. 4A illustrates the structure in more detail. More specifically, in the deposition mask 10 according to this embodiment of the present invention, as described above, the reflective film 30 (see FIG. 2F) is formed on the surface opposite to the surface of the resin film 11 on the side of a laser light source. When the light source irradiates the laser light, this laser light passes through the resin film 11, and then is reflected by the reflective film 30. This reflected light is absorbed in the resin left in the opening portions 11a, facilitating sublimation of this resin. However, as described above, laser light which has entered the resin film 11 vertically (at an incident angle of 0°) is reflected substantially vertically. However, some laser light enters the resin film 11 at given angles other than 0° This laser light is reflected diagonally by the reflective film 30 and may travel to the outside of the opening portion-formation region. Such laser light might strike a region on the back surface of the resin film 11 other than the opening portion-formation region. As a result, laser marks 11b are formed on the back surface of the resin film 11 as laser-light-irradiation signs. The depth of these laser marks 11b is approximately 0.1 μm, or 0.5 μm or less at most. In other words, the depth of the laser marks 11b ranges from approximately 0.1 or more to 0.5 μm or less. Thus, the laser marks 11b are less likely to affect the mechanical strength of the resin film 11 whose thickness is 5 μm or more. Moreover, as described above, the laser light from the light source is incident on the resin film 11 at an incident angle of approximately 30° or less. Then, the angle of refraction of which the laser light enters the resin film 11 having a greater refractive index has an angle of approximately 20° or less. If the close contact layer 20 has a greater refractive index than that of the resin film 11, the angle of refraction further decreases and the angle of reflection also further decreases. The reflected light is returned to within a limited, small region. As a result, the reflected light generated by the reflective film 30 does not spread out so widely, thus creating the laser marks 11b only around the opening portions 11a.

The laser marks 11b created in the above manner are less likely to decrease the mechanical strength of the resin film 11, as described above. Rather, the laser marks 11b are expected to effectively enhance the heat radiation of the resin film 11 by making its back surface uneven to increase the surface area. When the deposition mask 10 is used, a lower surface of the deposition mask 10 illustrated in FIG. 4A, namely, the back surface of the resin film 11 is fixed to the substrate for vapor deposition, whereas the metal support layer 12 of the deposition mask 10 faces a crucible of a vapor deposition source. In this case, since the vapor deposition material flies toward the deposition mask 10, the deposition mask 10 is exposed to high temperatures due to heat radiated from the vapor deposition source and greatly heated accordingly. When the temperature of the deposition mask 10 increases, the resin film 11 is expanded and the opening portions 11a are enlarged. As a result, the vapor deposition material may be deposited within a larger area than an intended area. If an organic EL display apparatus is manufactured with the deposition mask 10 formed in this manner, its pixel sizes may differ from one another, causing a lowered display quality. For this reason, it is not preferable that the temperature of the deposition mask 10 does not increase excessively. In view of the above, the surface of the deposition mask 10 which faces the vapor deposition source, namely, the upper surface illustrated in FIG. 4A is preferably a mirror surface that has a low heat radiation coefficient so as not to absorb heat from the vapor deposition source. However, the opposite surface of the deposition mask 10 preferably dissipates absorbed heat and has a great heat radiation coefficient. For this reason, the laser marks 11b that make the surface of the deposition mask 10 uneven contributes to enhancement of the heat radiation.

Figure 4B:
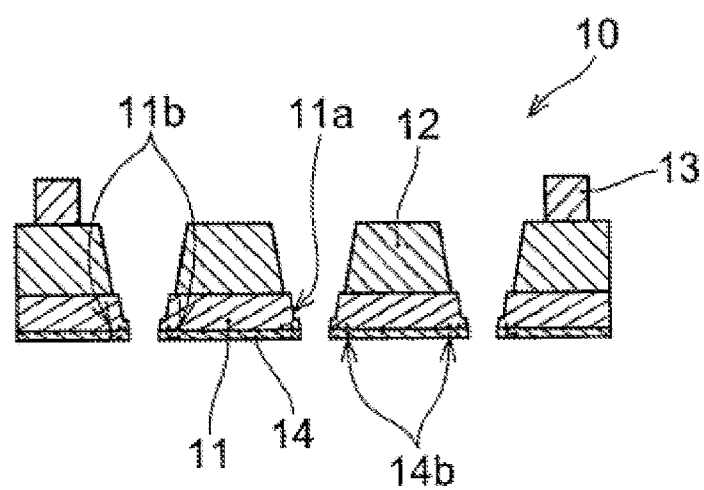
FIG. 4B is an explanatory view showing a cross section of a deposition mask according to a modification of FIG. 4A.

To further facilitate the heat radiation, the back surface of the resin film 11 is coated with a high-heat-radiation film 14 having a great heat radiation coefficient, as illustrated in FIG. 4B. The high-heat-radiation film 14 may be made of $Al_2O_3$, AlTiN, or graphite, for example, and formed with a sputtering, vacuum deposition, CVD method, or the like. For example, the high-heat-radiation film 14 may have a thickness of approximately several hundreds of nanometers. Among these processes, especially the sputtering process is preferred, because the sputtering process allows the high-heat-radiation film 14 to be formed in good contact with the resin film 11, which contributes to the heat radiation. Moreover, because of its considerably small thickness, the high-heat-radiation film 14 allows the laser mark 11b formed on the back surface of the resin film 11 to emerge on a back surface of the high-heat-radiation film 14 with its shape unchanged, thereby successfully forming projections and dents 14b.

Figure 8B:
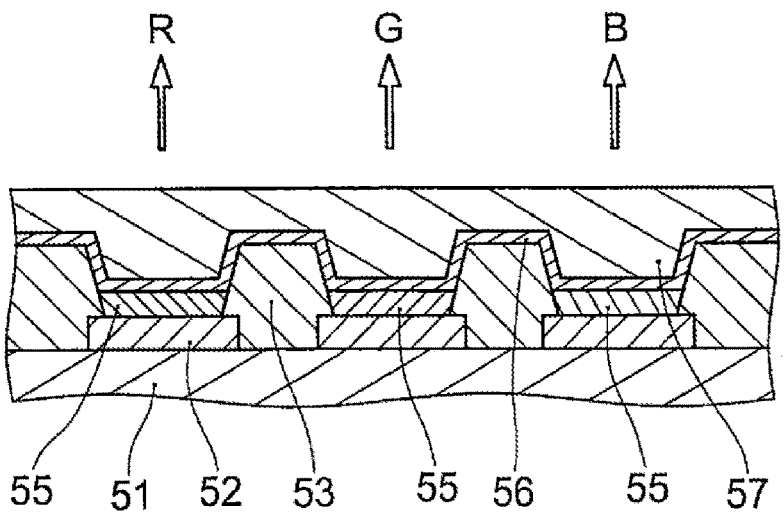
FIG. 8B is an explanatory cross-sectional view showing a manufacturing step in the method of manufacturing an organic EL display apparatus according to the embodiment of the present invention.

Next, a description will be given of a method of manufacturing an organic EL display apparatus by using the deposition mask 10 having the resin film manufactured in the above manner. Aside from the method of manufacturing the deposition mask 10, processes in the manufacturing method may be well-known processes. Thus, a description that will be given below with reference to FIGS. 8A to 8B is focused on a method of depositing organic layers by using the deposition mask 10.

In the method of manufacturing an organic EL display apparatus of the present invention, unillustrated TFTs, a planarizing layers, and a first electrode (for example, anodes) 52 are formed on an unillustrated support substrate. A device substrate 51 is thereby formed. The deposition mask 10 manufactured by the above method is overlaid and aligned on the device substrate 51. By depositing organic materials 54 on the device substrate 51, an organic deposition layer 55 formed of organic materials 54 is formed. And a second electrode (cathode) 56 is formed on the organic deposition layer 55.

The device substrate 51 may be formed in the following process. For example, although not illustrated completely, switching elements such as the TFTs are formed on the support substrate made of a glass plate, for example, in units of RGB sub-pixels in each pixel. The first electrode 52 connected to the switching element is formed on the planarizing layer by a combination of a metal film made of Ag, APC, or the like, and an ITO film, for example. As illustrated in FIGS. 8A and 8B, insulating bank 53 may be made of $SiO_2$, plastic, or the like, is formed between sub-pixels to divide these sub-pixels from each other. The above deposition mask 10 is aligned and fixed on the insulating banks 53 of the device substrate 51. This fixing may be performed by attracting the deposition mask 10 to a magnet, for example, disposed on the opposite side of the device substrate 51. The opening portion 11a in the deposition mask 10 is formed so as to be smaller than a gap between opposed walls each other, of the insulating bank 53. Therefore, the organic material 54 is suppressed from depositing to side wall of the insulating bank 53, thereby preventing lowered light emitting efficiency.

In this state, as illustrated in FIG. 8A, a vapor deposition source (crucible) 60 in a vapor deposition apparatus evaporates the organic material 54. Then, the organic material 54 is deposited only on parts of the device substrate 51 exposed from the opening portions 11a of the deposition mask 10. In this way, the organic deposition layer 55 is formed on the first electrodes 52 in desired sub-pixels. As described above, the opening portions 11a in the deposition mask 10 is formed so as to be smaller than a gap between opposed walls each other, of the insulating bank 53. Therefore, the organic material 54 is suppressed from depositing to side wall of the insulating bank 53. As a result, as illustrated in FIGS. 8A and 8B, the organic deposition layer 55 is deposited substantially only on the first electrodes 52. This vapor deposition step may be performed on each sub-pixel by sequentially replacing one deposition mask with another. Alternatively, a deposition mask may be used to deposit the same material on a plurality of sub-pixels at one time.

FIGS. 8A and 8B each simply illustrate the organic deposition layer 55 by a single layer, but in fact the organic deposition layer 55 may be formed of the deposition layers 55 of a plurality of layers made of different materials. For example, a hole injection layer is provided as a layer in contact with the anode 52 in some cases. The hole injection layer improves a hole injection property and is made of material having a good ionization energy matching. A hole transport layer is formed of, for example, an amine-based material on the hole injection layer. The hole transport layer improves stable transportability of holes and enables confinement of electrons (energy barrier) into a light emitting layer. Further, the light emitting layer, which is selected depending on a target emission wavelength, is formed on the hole transport layer, for example, by doping red or green organic phosphor material into $Alq_3$, for the red or green wavelength. As a blue-type material, a bis(styryl)amine (DSA)-based organic material is used. An electron transport layer is formed of $Alq_3$, for example, on the light emitting layer. The electron transport layer improves an electron injection property and stably transports electrons. These respective layers, each having a thickness of approximately several tens of nanometers, are deposited to form the organic deposition layer 55. It should be noted that an electron injection layer, such as LiF or Liq, which improves the electron injection property, may also be provided between the organic layers and the metal electrode.

In the organic deposition layer 55, an organic layer of a material corresponding to each color of RGB is deposited as the light emitting layer. In addition, the hole transport layer, the electron transport layer, and other similar layers are preferably deposited separately by using materials suitable for the light emitting layer, if emphasis is placed on light emission performance. However, in consideration of the material cost, the same material common to two or three colors of RGB may be deposited in some cases. In a case where the material common to sub-pixels of two or more colors is deposited, the deposition mask is formed to have opening portions formed in the sub-pixels sharing the common material. In a case where individual sub-pixels have different deposited layers, for example, one deposition mask 10 is used for sub-pixels of R, so that the respective organic layers can be sequentially deposited. In a case where an organic layer common to RGB is deposited, other organic layers for the respective sub-pixels are deposited up to the lower side of the common layer, and then at the stage of the common organic layer, the common organic layer is deposited across the entire pixels at one time using the deposition mask 1 with the opening sections formed at RGB sites.

After finishing the formation of all the organic layers of the organic deposition layer 55 and the electron injection layer, such as a LiF layer, the deposition mask 10 is removed, and then a second electrode (e.g., cathode) 56 is formed over the entire surface. An example illustrated in FIG. 8B is a top emission type, in which light is emitted from a top side in the figure. Thus, the second electrode 56 may be formed of a light-transmissive material, for example, a thin Mg—Ag eutectic layer. Alternatively, for example, Al may be used. It should be noted that in a bottom emission type which emits light from a side of the device substrate 51, ITO or $In_3O_4$, for example, may be used for the first electrodes 52, and metals having low work functions, for example, Mg, K, Li, or Al may be used for the second electrode 56. A protective layer 57 made of, for example, $Si_3N_4$, is formed on a surface of the second electrode 56. It should be noted that the whole deposited layers are sealed with a sealing layer made of glass or a moisture-resistant resin film (not illustrated), for example, and is thus configured to prevent the organic deposition layer 55 from absorbing moisture. Alternatively, a structure can also be provided in which the organic layers may be made common or shared as much as possible, and a color filter may be provided on the surface side of the organic layers.

REFERENCE SIGNS LIST

10 Deposition mask
10*a* Resin film assembly
10*b* Mask member
11 Resin film
11*a* Opening portion
11*b* Laser mark
12 Metal support layer
12*a* Seed layer
12*b* Metal film
12*c* Opening hole
13 Frame
14 High-heat-radiation film
14*b* projections and dents
20 Close contact layer
30 Reflective film
31 Aluminum single-crystal film
32 Multilayer films
35 Process stage
36 Support substrate
41 Laser mask
41*a* Opening portion
41*b* Light-shielding thin film
42 Optical lens
45 Collimating lens
51 Device substrate
52 First electrode
53 Insulating bank
54 Organic material
55 Organic deposition layer
56 Second electrode
57 Protective layer

What is claimed is:

1. A deposition mask comprising:
a resin film defining a plurality of opening portions, each of the plurality of opening portions extending through the resin film, the resin film comprising a first surface and a second surface opposite to the first surface, the second surface being configured to face a vapor deposition source during vapor deposition; and
a high-heat-radiation film on the first surface; wherein the high-heat-radiation film is in direct contact with the resin film;
wherein the resin film defines dents comprising laser marks on the first surface.

2. The deposition mask according to claim 1, further comprising a metal support layer formed on the second surface of the resin film, the metal support layer supporting the resin film.

3. The deposition mask according to claim 2, wherein the metal support layer surrounds the plurality of opening portions of the resin film.

4. The deposition mask according to claim 2, wherein the metal support layer comprises posts surrounding each of the plurality of opening portions.

5. The deposition mask according to claim 2, further comprising a frame on a surface of the metal support layer away from the resin film, wherein the frame surrounds the plurality of opening portions.

6. The deposition mask according to claim 1, wherein the high-heat-radiation film is made of $Al_2O_3$, AlTiN, or graphite.

7. The deposition mask according to claim 1, wherein the high-heat-radiation film has a thickness of several hundreds of nanometers; and the high-heat-radiation film has projections and dents.

8. The deposition mask according to claim 1, wherein a depth of the laser marks ranges from 0.1 μm or more to 0.5 μm or less.

9. The deposition mask according to claim 1, wherein the plurality of opening portions is arranged in an array.

\* \* \* \* \*